United States Patent
Yoshida et al.

(10) Patent No.: US 7,164,148 B2
(45) Date of Patent: Jan. 16, 2007

(54) LIGHT EMITTING DEVICE

(75) Inventors: Hiroshi Yoshida, Kanagawa (JP);
Tadashi Taniguchi, Kanagawa (JP);
Takashi Mizuno, Miyagi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/515,141

(22) PCT Filed: Mar. 16, 2004

(86) PCT No.: PCT/JP2004/003492

§ 371 (c)(1),
(2), (4) Date: Nov. 19, 2004

(87) PCT Pub. No.: WO2004/086574

PCT Pub. Date: Oct. 7, 2004

(65) Prior Publication Data

US 2005/0242359 A1    Nov. 3, 2005

(30) Foreign Application Priority Data

Mar. 24, 2003    (JP) .............................. 2003-081365

(51) Int. Cl.
*H01L 33/00* (2006.01)

(52) U.S. Cl. .......................... 257/13; 257/79; 257/100; 257/E23.023

(58) Field of Classification Search ......... 343/700 MS, 343/729, 829, 846, 853, 860, 909; 257/13, 257/79, 100, E23.023, 676
See application file for complete search history.

(56) References Cited

U.S. PATENT DOCUMENTS

| 6,396,023 | B1 | 5/2002 | Aikiyo |
| 6,404,786 | B1 | 6/2002 | Kondo et al. |
| 2002/0100914 | A1* | 8/2002 | Yoshida ....................... 257/98 |

FOREIGN PATENT DOCUMENTS

| EP | 655813 | 5/1995 |
| JP | 2003-298170 | 10/2003 |

* cited by examiner

*Primary Examiner*—N. Drew Richards
*Assistant Examiner*—Sean Fletcher
(74) *Attorney, Agent, or Firm*—Robert J. Depke; Rockey, Depke, Lyons & Kitzinger LLC

(57) ABSTRACT

A CAN package light emitting device comprises a semiconductor laser 1 bonded on a sub mount 6 and a CAN package 2 for housing the semiconductor laser 1 bonded on the sub mount 6. The CAN package 2 comprises a fixing structure 3 for fixing the semiconductor laser at a predetermined position, and a cap 4 covering the semiconductor laser 1 fixed to the fixing structure 3. Vapor pressure of Si organic compound gas in the CAN package 2 is limited to or below $5.4 \times 10^2$ N/m$^2$ to prevent any deposit as thick as inviting characteristics deterioration from being formed on the light emitting portion of the semiconductor laser 1 within the guaranteed time of its proper operation.

1 Claim, 19 Drawing Sheets

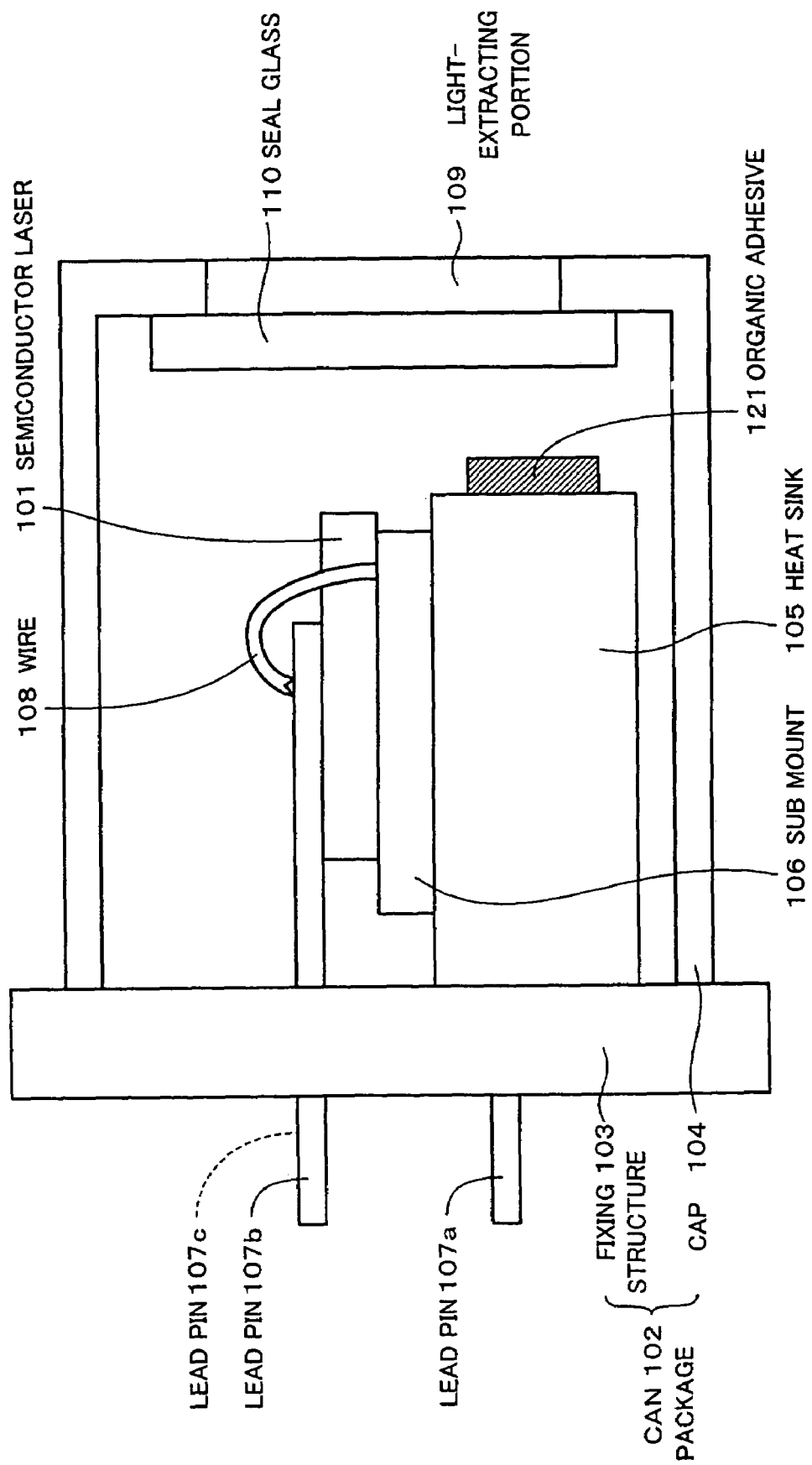

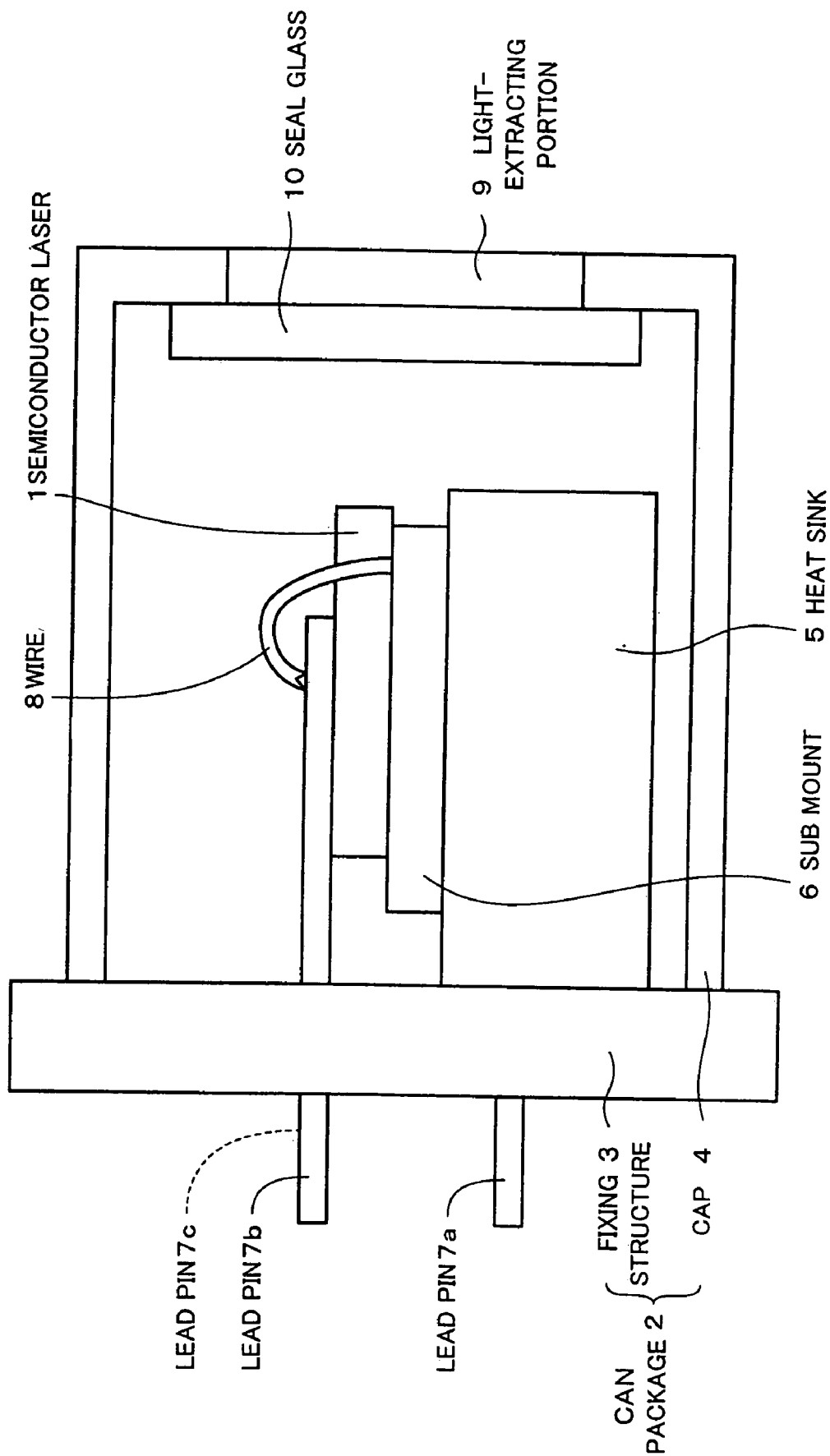

IN DRY OZONE ATMOSPHERE

LIGHT EMITTING DEVICE

This application claims priority to Japanese Patent Application Number jp2003-081365, filed Mar. 24, 2003 which is incorporated herein by reference. This application is a 371 of PCT/JP04/03492, filed Mar. 16, 2004.

TECHNICAL FIELD

The present invention relates to a light emitting device having a configuration holding a light emitting element in a package.

BACKGROUND ART

Optical discs including CDs (Compact Discs), DVDs (Digital Versatile Discs) and MDs (Mini Discs) have been widespread recently. Optical disc systems for recording and reproduction of information with these discs have so-called pickups therein.

Optical pickups can be classified to discrete type pickups and hybrid type pickups. Discrete type pickups are equipped with an objective lens, beam splitter, collimator lens, cylindrical lens, semiconductor laser and PD (Photo Detector). Hybrid type pickups are equipped with an objective lens and an integrated optical device incorporating all elements other than the objective lens.

In discrete type pickups, the semiconductor laser is held in a package called CAN package. In hybrid type pickups, the integrated optical device is held in a package called flat package. Herein below, a CAN package holding a semiconductor laser will be called a CAN package light emitting device, and a flat package holding an integrated optical element is called a flat package light emitting device.

FIG. 17 shows a configuration of a CAN package light emitting device. As shown in FIG. 17, the CAN package 102 houses a semiconductor laser 101 bonded on a sub mount 106 as well as a monitor PD (not shown). For bonding the semiconductor laser 101 to the sub mount 106, a solder of Sn, SnPd, AuSn, In, or the like, is used. The structure having the semiconductor laser 101 bonded on the sub mount 106 is herein called LOS. For bonding a heat sink 105 to the sub mount 106, Ag paste is used. For bonding the package 102 to the monitor PD, Ag paste is used. The Ag paste can be regarded as an organic adhesive containing Ag powder.

FIG. 18 shows a configuration of a flat package light emitting device. As shown in FIG. 18, the flat package 112 houses a sub mount 115 supporting a semiconductor laser 111 bonded thereon, mirror prism 116 and PDIC (Photo Detector Integrated Circuit) 117. For bonding the semiconductor laser 111 to the sub mount 115, a solder of Sn, SnPb, AuSn, In, or the like, is used. The flat package light emitting device shown here has the LOS structure having the semiconductor laser 111 and the sub mount 115 bonded together.

For bonding the sub mount 115 to the holder shell 113, Ag paste is used. For bonding the PDIC 117 to the holder shell 113, Ag paste is used. As mentioned above, the Ag paste can be regarded as an organic adhesive containing Ag powder. For bonding the mirror prism 116 to the holder shell 113, an epoxy organic adhesive utilizing ultraviolet-setting, thermosetting or combination of ultraviolet and heat is used. For bonding seal glass 114 to the holder shell 113, an epoxy organic adhesive, for example, is used in general.

As mentioned above, in both CAN package light emitting devices and flat package light emitting devices, organic adhesives are used for bonding parts to the packages. Organic adhesives can be classified to metamorphic acrylate adhesives, epoxy adhesives, silicone adhesives, and so on, depending upon the base polymer. In terms of the form of curing reaction, they can be classified to ultraviolet-setting type adhesives that start curing with irradiation of ultraviolet rays; thermosetting type adhesives that start curing with application of heat; adhesives that start curing by reaction with oxygen; and so on. To determine the form of curing reaction, so-called curing agents are added to organic adhesives.

As mentioned above, adhesives are generally classified in terms of the base polymer and form of curing reaction. However, even in a common class, adhesives are usually different in physical and chemical properties. To control these properties, various substances are added in form of compounds.

For example, so-called catalysts are added to assist reactions. Furthermore, other substances are added to adhesives to control various properties such as viscosity before setting, hardness after setting, interfacial chemical coupling forms, and so on.

Moreover, fine particles of metals such as Ag, Au, Cu, and so forth, are added to some adhesives to control the heat conductivity and electrical conductivity. They are widely known as Ag paste, Au paste and Cu paste. Even in this case, various substances are added to control the physical property such as viscosity, hardness, dielectric constant, and so on.

Adhesives are combined for dedicated use depending upon the natures of parts to be bonded, intended properties after their combination, environment of intended use of the entire device composed of the parts. Combinations of adhesives are know-how of manufacturers and developers of adhesives, and details of components of adhesives are not opened to users in most cases.

Characteristics deterioration of semiconductor lasers caused by adhesives will be discussed below. Heretofore known are (1) characteristics deterioration by diffusion of heat and (2) characteristics deterioration by generation of gas as characteristics deterioration of semiconductor lasers caused by adhesives.

(1) Characteristics Deterioration by Diffusion of Heat

In case a semiconductor laser is in contact with an adhesive containing metal, it is known that characteristics of the semiconductor laser deteriorate due to the metal contained in the adhesive and diffusing into the semiconductors.

For example, in case the semiconductor laser is bonded to a package by an adhesive containing Na, the following process of deterioration is known. First, Na receives heat energy and diffuses into the semiconductor laser. As the diffusion progresses, Na reaches the proximity of the active layer of the laser, and deteriorates the emission efficiency (because it functions as an absorber). Otherwise, Na destroys the p/n bonding interface, and invites changes in wavelength and deterioration of emission efficiency.

Also when the metal contains in the adhesive is Zn or Pd, it has been known that semiconductor lasers are subject to characteristics deterioration. For example, characteristic deterioration caused by an adhesive containing Zn is a well-known phenomenon in semiconductor lasers made of GaInP compound semiconductors for the band of 650 nm. It causes shifting to longer wavelengths by destruction of natural superlattices (which is sometimes used positively) or degradation of emission efficiency, which finally results in an increase of the drive current.

In view of these problems, it has been proposed to use a solder material as the adhesive by forming a diffusion stop layer between the adhesive and the semiconductor laser. In a structure where the adhesive is not in direct contact with the semiconductor, Ag paste is used frequently. In this case, the phenomenon of undesirable diffusion into the semiconductor does not occur. Used as the solder material is a metal such as Sn, SnPb, In, AgSn or AuSn. These metals used as the solder material have a high purity. Especially when the semiconductor laser does not include defects (in particular, penetrating dislocation), a material having a smaller diffusion constant is used. Furthermore, a material suppressing diffusion of the solder is frequently used as the semiconductor bonding surface. For example, Pt is frequently used for this purpose (for example, as the p-side electrode for the band of 780 nm or p-side electrode for the band of 650 nm). By using this type of structure, it is possible to prevent deterioration of the operative characteristics of the semiconductor laser by diffusion of the metal elements into the semiconductor.

FIG. 19 shows a semiconductor laser having a diffusion stop layer. As shown in FIG. 19, an adhesive layer 122 of a solder, Au layer 123 bringing about mutual diffusion with the solder, diffusion stop layer 124 for preventing diffusion of the solder, and Ti layer 125 for bonding of the semiconductor laser 126 and the metal are sequentially stacked on a sub mount 121. The semiconductor laser 126 is bonded on the Ti layer 125.

(2) Characteristics Deterioration by Generation of Gas

As referred to above, organic adhesives are made of mixing many compounds, and volatile substances may be included in the components. In some cases, vaporization of the base polymer itself may occur depending upon the curing condition. Although the packages are different in sealing capability, they define essentially sealed spaces. Therefore, gas of volatile substances reaches and adheres to the outer wall of the package or other members mounted in the package, as well as the lid, and invites deterioration of characteristics. Especially in the flat package light emitting device shown in FIG. 18, organic adhesives causing characteristics deterioration are widely used.

For example, in the flat package light emitting device shown in FIG. 18, the seal glass 114 has the function of transmitting light. If the volatile components adhere and cure on the light-transmitting portion thereof of the seal glass 114 and seriously degrades the transmittance, it invites deterioration of the light path and the distribution of the emission intensity.

For example, in case of a flat package light emitting device to be mounted in an optical disc system, wavefront aberration will significantly increase, and it will disturb reproduction of signal from a disc and writing of signal on the disc.

Therefore, adhesives that will generate less amounts of gas are usually chosen as adhesives. To avoid characteristics deterioration, the use of epoxy adhesives less volatile than acrylic adhesives, for example, is regarded preferable. Among a common kind of base polymers, the use of ultrasonic-setting type polymers is considered more preferable than the use of thermosetting type polymers.

Vaporization from adhesive is caused by heat in general. Vaporizing amount n can be expressed in terms of the capacity V, temperature T in the package, and the intrinsic saturation vapor pressure of the volatile components.

That is, the vaporizing amount n can be expressed as $$n = PV/RT \quad (1)$$

Regarding adhesion to other members, it is assumed that the vaporizing gas solidifies on these members by thermal reaction, i.e. because the temperature of the members is lower than the temperature of the gas.

Organic resins shaped to desired configurations, either thermosetting or thermoplastic, or regardless of their processing methods, are widely used as lead frame packages for housing integrated optical elements. These packages are composed of shaped organic resins and metal portions. It has been believed heretofore that the organic resins used in those packages do not cause the same deterioration as the above-mentioned deterioration by adhesives.

Recently, shorter wavelengths and higher optical outputs have been required with semiconductor lasers. For example, according to the next-generation high-density optical discs (Blu-ray Discs), wavelength of the laser light used for recording and reproduction is 405 nm. As a light source for emitting laser light of this wavelength, the use of a group III nitride compound semiconductor laser is under examination.

However, the Inventor prepared a packaged light emitting device housing a 405 nm semiconductor laser, and repeated various experiments with this light emitting device. As a result, the Inventor has found that the light emitting device is subjected to fluctuation of the drive current, fluctuation of the optical output, changes of the beam profile and deviation of the optical axis.

DISCLOSURE OF INVENTION

It is therefore an object of the invention to provide a light emitting device including a light emitting element for emitting light and a package housing at least the light emitting element, which is free from fluctuation of the drive current, fluctuation of optical output, changes of the beam profile and deviation of the optical axis.

To achieve the object, the invention provides a light emitting device having a light emitting element for emitting light and a package housing at least the light emitting device, characterized in that the vapor pressure of Si organic compound gas in the package is limited lower than or equal to $5.4 \times 10^2$ N/m$^2$.

According to the invention summarized above, since the vapor pressure of the Si organic compound gas in the package is limited to or below $5.4 \times 10^2$ N/m$^2$, any deposit as thick as inviting characteristics deterioration is prevented from accumulating on the light emitting portion of the light emitting element.

BRIEF DESCRIPTION OF DRAWINGS

FIG. 1 is a schematic diagram showing configuration of a CAN package light emitting device employed a testing example;

FIG. 13 is a schematic diagram showing a configuration of a CAN package light emitting device according to an embodiment of the invention;

BEST MODE FOR CARRYING OUT THE INVENTION

Figure 2A:
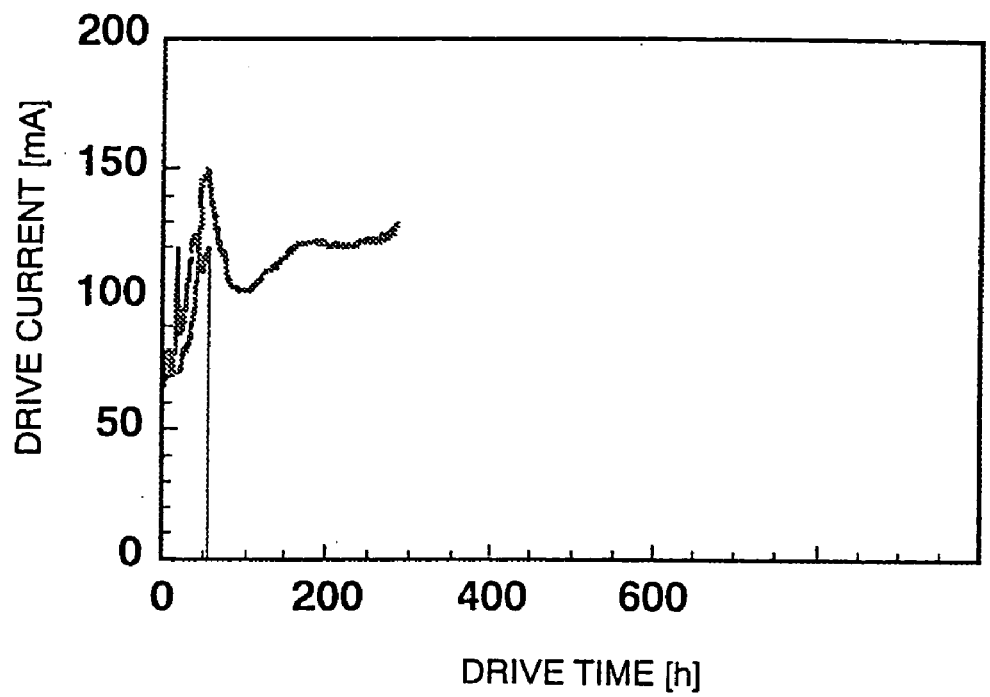
FIGS. 2A and 2B are graphs showing a result of a drive current fluctuation test with a CAN package light emitting device.

For easier understanding of subject matters of the present invention, first explained are the contents of examination made by the Inventor to overcome the problems involved in the conventional techniques.

The Inventor first prepared Sample 1 including an organic adhesive in a CAN package and Sample 2 not including any organic adhesive in a CAN package. FIG. 1 shows the configuration of Sample 1. As shown in FIG. 1, Sample 1 comprised a semiconductor laser 101 bonded to a sub mount 106 and a CAN package 102 for housing the semiconductor laser 101 bonded to the sub mount 106. The semiconductor laser 101 was a 405 nm band GaN compound semiconductor laser.

The Inventor prepared Sample 1 as explained below. First, the Inventor bonded the semiconductor laser 101 and the sub mount 106 together, with Sn solder. The Inventor next bonded the sub mount 106 and a heat sink 105 extending from a fixing structure 103 with Sn solder. Then, the Inventor connected an Au wire 108 for extraction of the electrode.

Next as shown in FIG. 1, the Inventor coated and cured an organic adhesive (ultraviolet-setting epoxy adhesive) 121 on a location out of direct contact with the GaN semiconductor laser and not exposed to direct laser light. The Inventor next bonded a cap 104 and the fixing structure 103 together by electric welding in dry air. The cap 104 made of a metal and seal glass 110 had been bonded beforehand with glass having a low fusing point.

In this manner, the Inventor prepared Sample 1 without using any organic adhesive for bonding of components. That is, Sample 1 had a structure not including any organic adhesive in the CAN package 2 excluding the organic adhesive 121.

The Inventor prepared Sample 2 in the same process as the foregoing Sample 2 except the step of coating the organic adhesive. That is, Sample 2 had a structure not including any organic adhesive in the CAN package 2.

With Sample 1 and Sample 2 prepared in the above-explained process, the Inventor carried out a test for examining changes of the drive current (APC aging) fixing the temperature at 60° C. and the optical output at 30 mW.

Figure 2B:
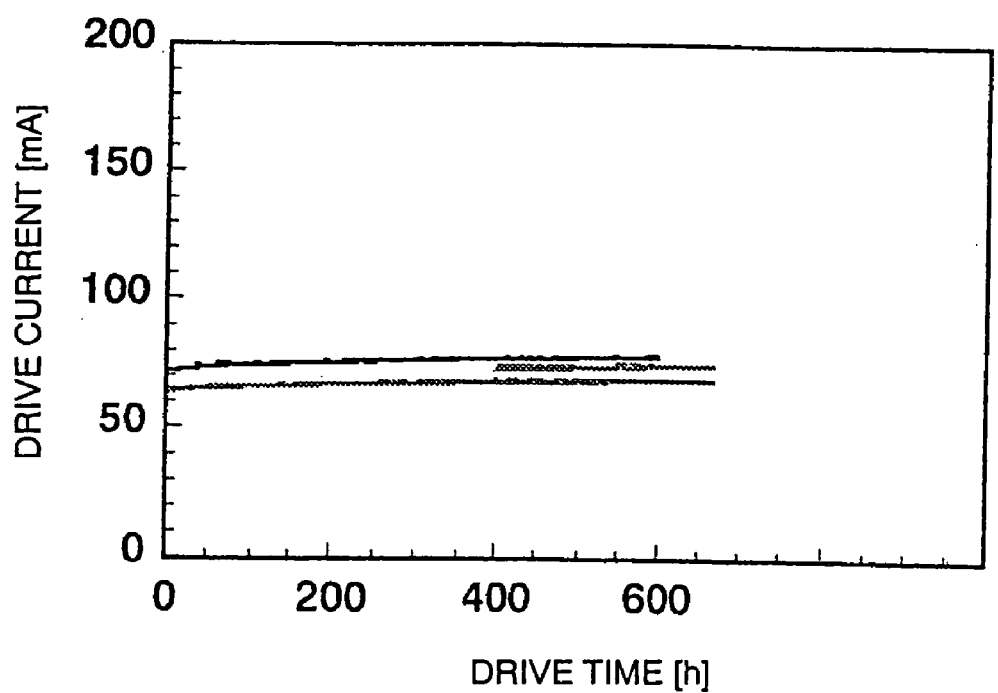

FIG. 2A shows a result of the drive current fluctuation test of Sample 1. FIG. 2B shows a result of the drive current fluctuation test of Sample 2. In FIGS. 2A and 2B, the abscissa and the ordinate graduate the drive time and the drive current respectively.

It is appreciated from FIGS. 2A and 2B that Sample 1 does not fluctuate in drive current with time whereas Sample 2 fluctuates in drive current with time. Therefore, it is appreciated that the periodical fluctuation of the drive current is a phenomenon caused by involvement of the ultraviolet-setting epoxy adhesive coated inside the package. This kind of fluctuation of the drive current is a serious problem in systems, such as optical disc systems, required to drive semiconductor lasers to emit desired optical outputs.

With Sample 1 and Sample 2 after the drive current test, the Inventor observed edges of the semiconductor lasers individually with a differential interference microscope.

Figure 3A:
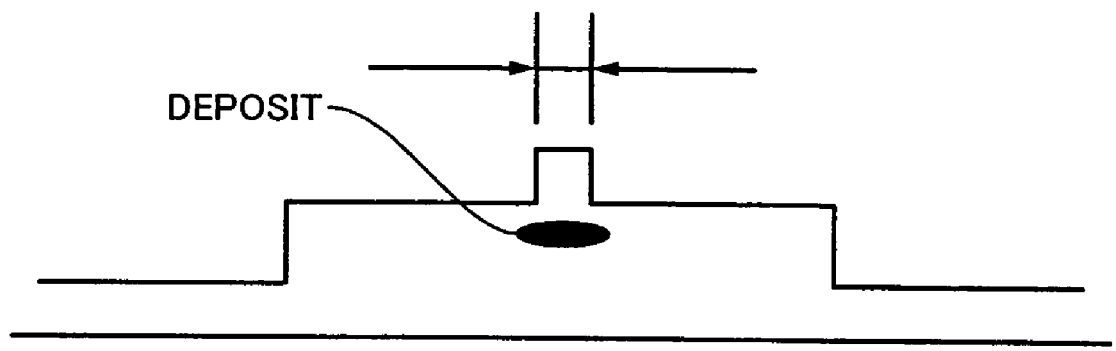
FIGS. 3A and 3B are schematic diagrams showing a result of observation of a semiconductor laser by a differential interference microscope.
Figure 3B:
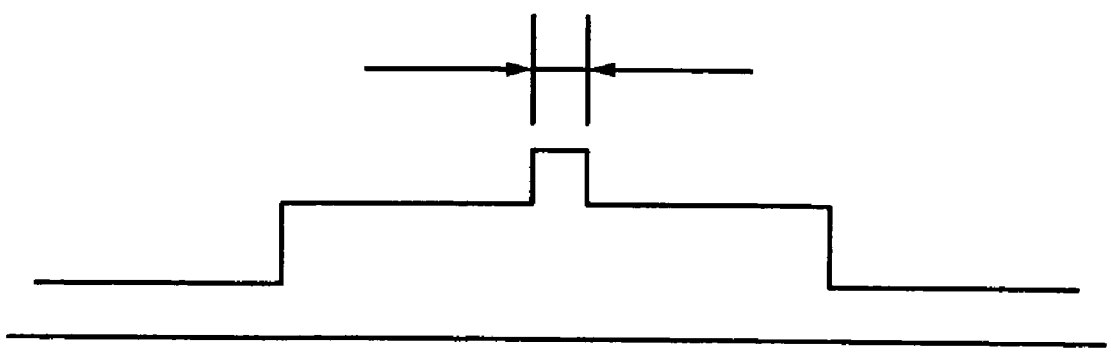

FIG. 3A shows a result of observation by differential interference microscopy of the semiconductor laser in Sample 1. FIG. 3B shows a result of observation by differential interference microscopy of the semiconductor in Sample 2. It is appreciated from FIGS. 3A and 3B that no deposit is found on the edge of semiconductor in Sample 2, which was constant in drive current, but a deposit is found on the edge of the semiconductor laser in Sample 1 that exhibited periodical changes of the drive current. Since the deposit is found only on the light emitting portion, the deposition is considered a phenomenon caused by involvement of the laser light.

Additionally, the Inventor prepared another sample having the same configuration as Sample 1. With this sample after being stored in an environment of 60° C. without supplying the semiconductor laser with power, the Inventor observed an edge of the semiconductor laser by differential interference microscopy. No deposit as mentioned above was found in this observation. This additionally permits the assumption that the deposition is a phenomenon caused by involvement of the laser light.

After that, with Sample 1 after the drive current test, the Inventor observed an edge of the semiconductor laser through a transmission electron microscope (TEM).

Figure 4:
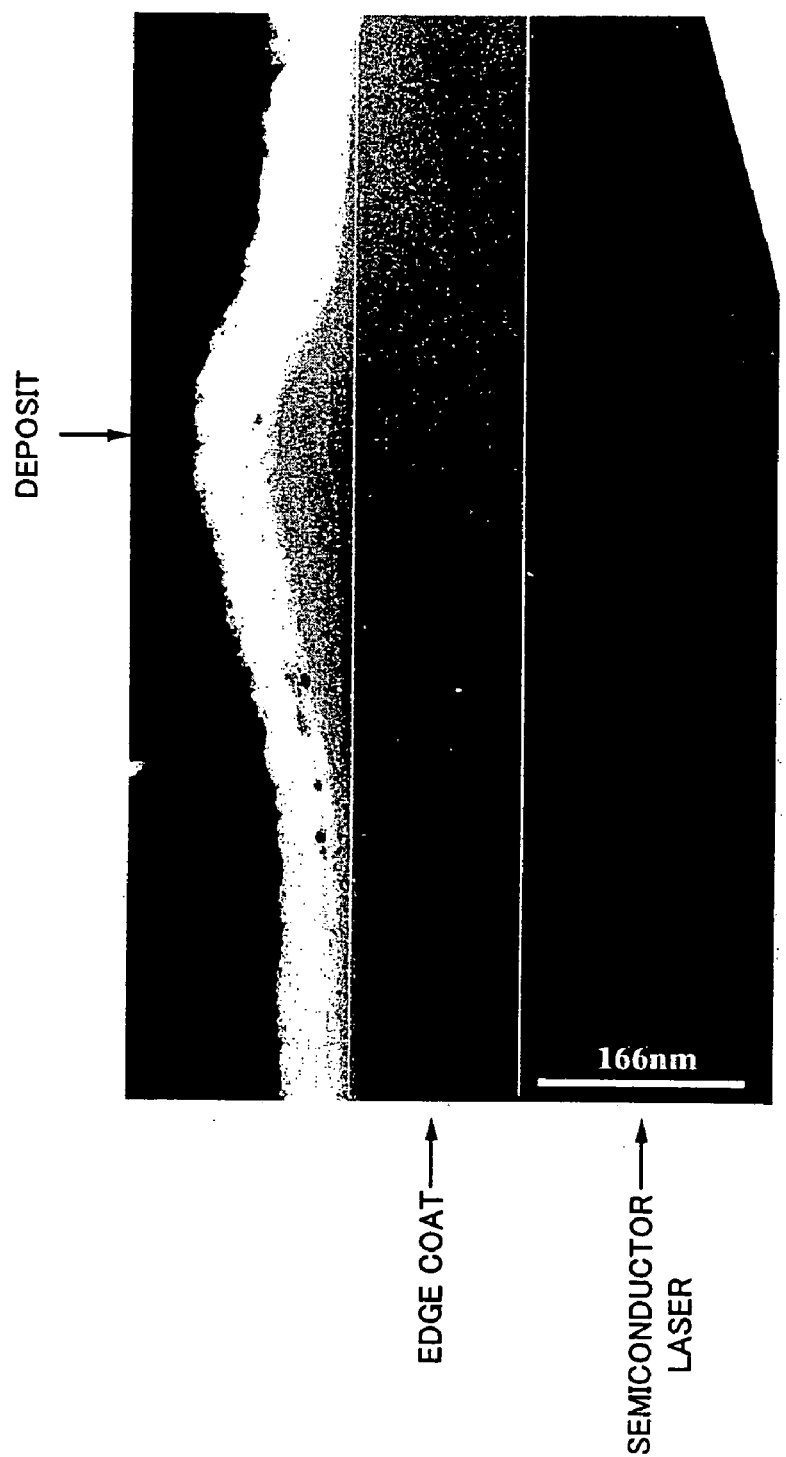
FIG. 4 is a TEM image of an edge of a semiconductor laser.

FIG. 4 shows a TEM image of the edge of the semiconductor laser in Sample 1. It is appreciated from FIG. 4 that the distribution of the deposit is not uniform on the edge of the semiconductor laser but it follows the near field pattern (NFP), i.e. light intensity profile near the light emitting edge.

After that, the Inventor carried out componential analysis by EDX (Energy Dispersive X-Ray Spectroscopy).

Figure 5:
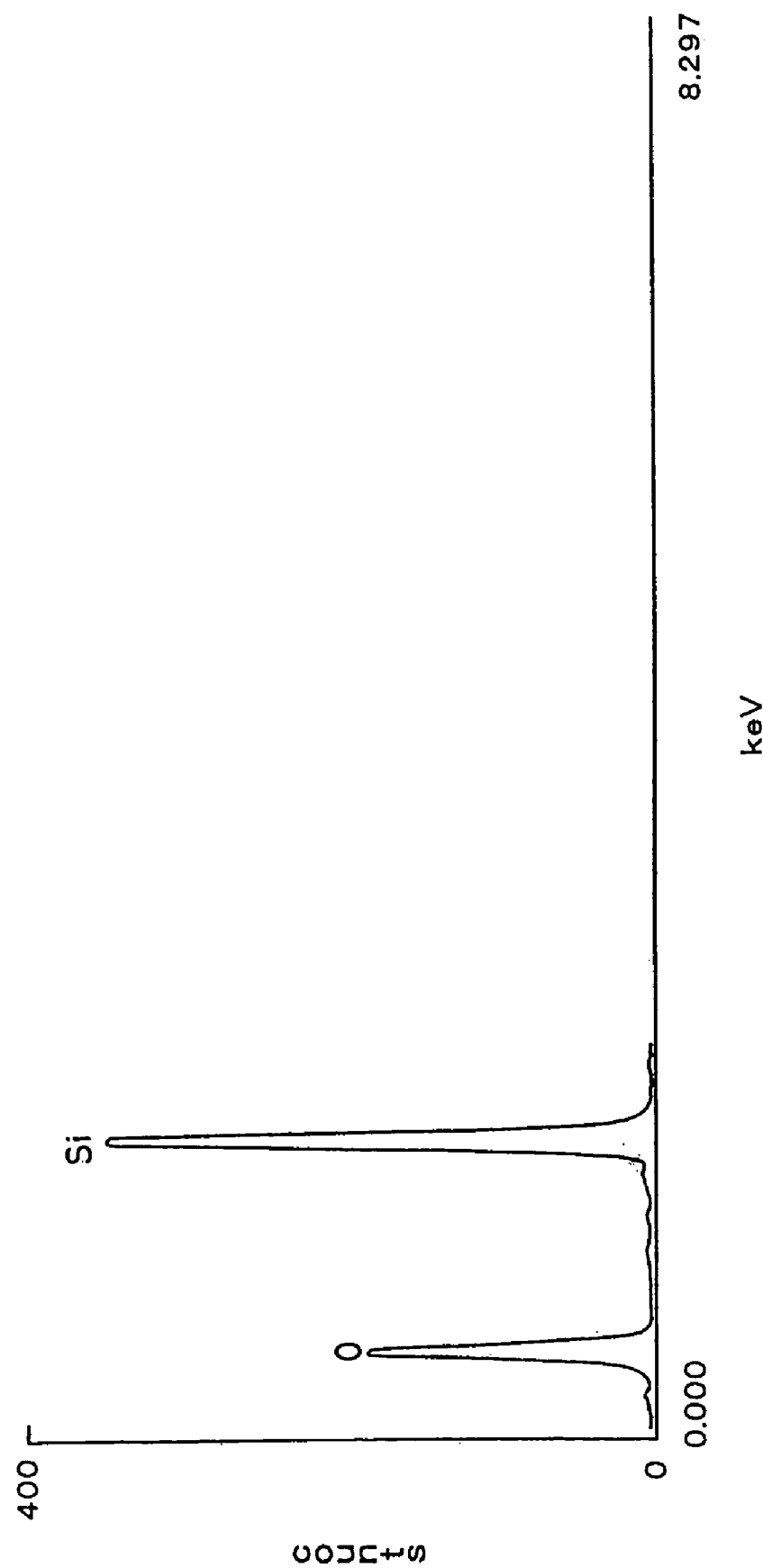
FIG. 5 is a graph showing a result of componential analysis by EDX function.

FIG. 5 shows a result of the componential analysis by EDX. It is appreciated from the result of componential analysis that the deposit on the edge of the semiconductor laser comprises Si and O.

Subsequently, the Inventor measured far field patterns (FFP) in Samples 1 ad 2.

Figure 6A:
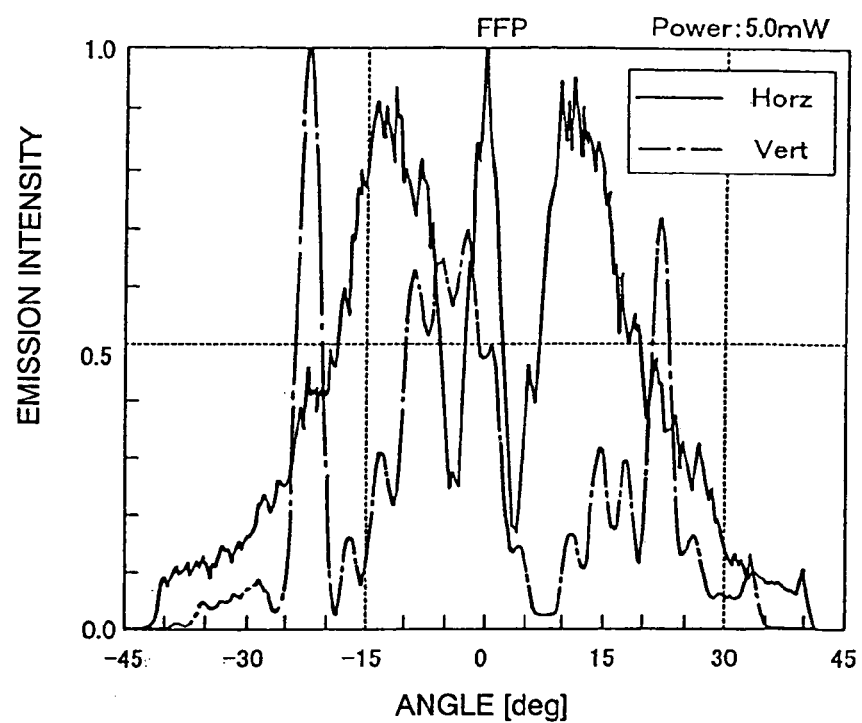
FIGS. 6A and 6B are graphs showing a far-field pattern of a semiconductor laser.
Figure 6B:
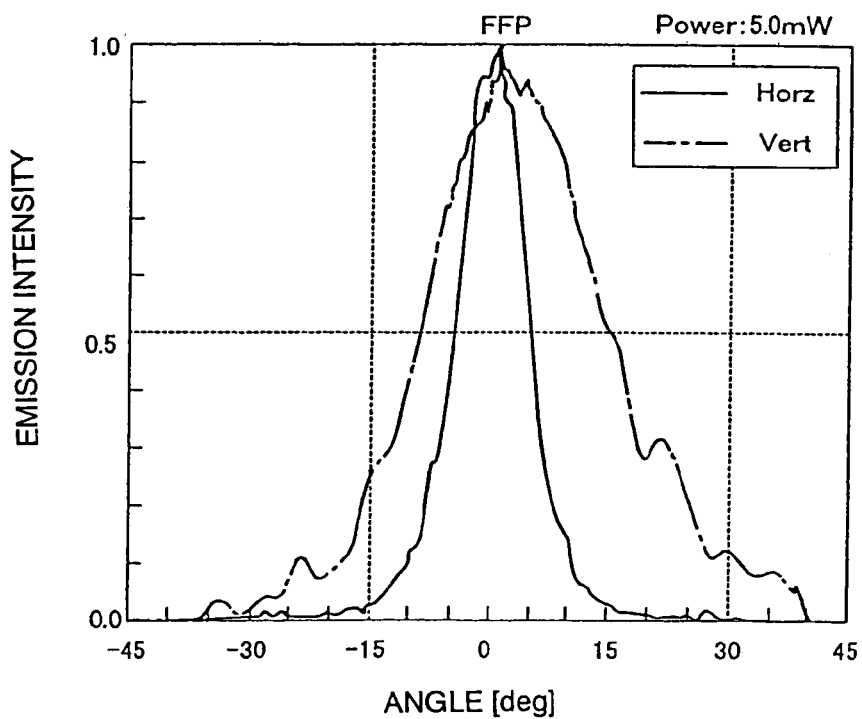

FIG. 6A shows a far field pattern of the semiconductor laser in Sample 1. FIG. 6B shows a far field pattern of the semiconductor laser in Sample 2. Note that the far field patterns shown in FIGS. 6A and 6B are normalized based on the peak values. It is appreciated from FIGS. 6A and 6B that the far field pattern of Sample 2 is single-peaked but the far field pattern of Sample 1 is not single-peaked. In this case, systems, such as optical discs, configured to condense laser light to the limit of diffraction, become unable to condense laser light, and serious troubles will occur.

Through the above-summarized researches, the Inventor has realized that, even when an adhesive is positioned out of direct contact with a 405 nm band GaN compound semiconductor laser, a deposit is formed on the laser edge in about 100 hours when the semiconductor laser is driven under the condition fixing the temperature at 60° C. and the optical output at 30 mW.

The Inventor next conducted simulation about the drive current of the semiconductor laser. In this simulation, the Inventor drove the semiconductor laser under the condition for optical output of 30 mW when the refractive index was not 1 and an absorptive substance was deposited on the semiconductor laser edge. In addition, the refractive index was complex index of refraction, and absorptivity was used as a parameter.

Figure 7:
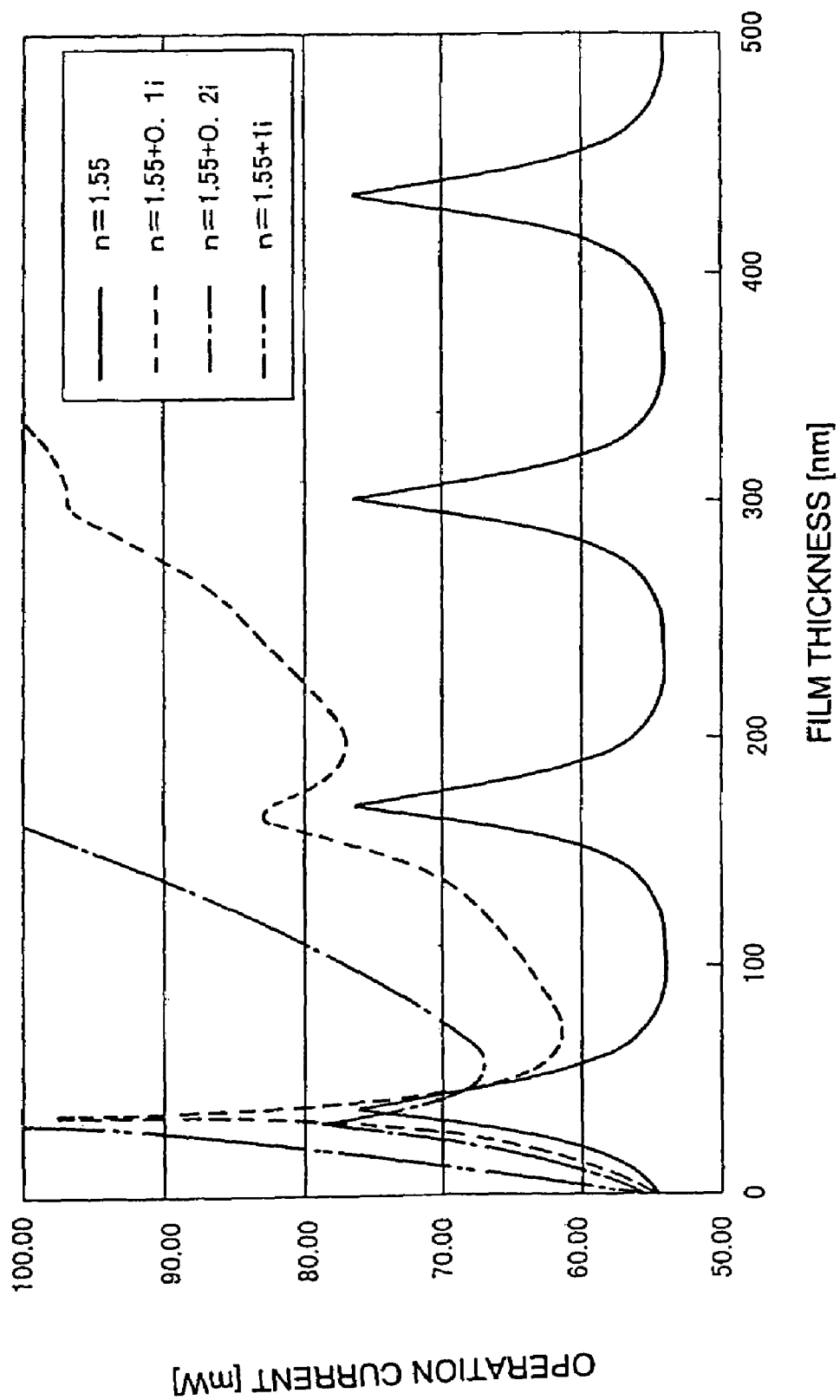
FIG. 7 is a graph showing a result of simulation, which shows fluctuation of the current value.

FIG. 7 shows a result of the simulation about the drive current value. When FIG. 7 is compared with FIG. 2A, changes in drive current by the experiment approximately coincide with changes in drive current by the simulation. Therefore, it is noted that when any substance having a refractive index (other than 1) and absorptivity adheres on the edge of the semiconductor laser, the drive current value periodically fluctuates depending upon the thickness of the deposit. That is, it will be possible to determine that a substance containing Si and O gradually accumulates on the edge while the semiconductor laser is driven.

The Inventor next analyzed componential elements of the deposit on the semiconductor laser edge by field emission Auger electron spectroscopy (FE-AES).

Figure 8:
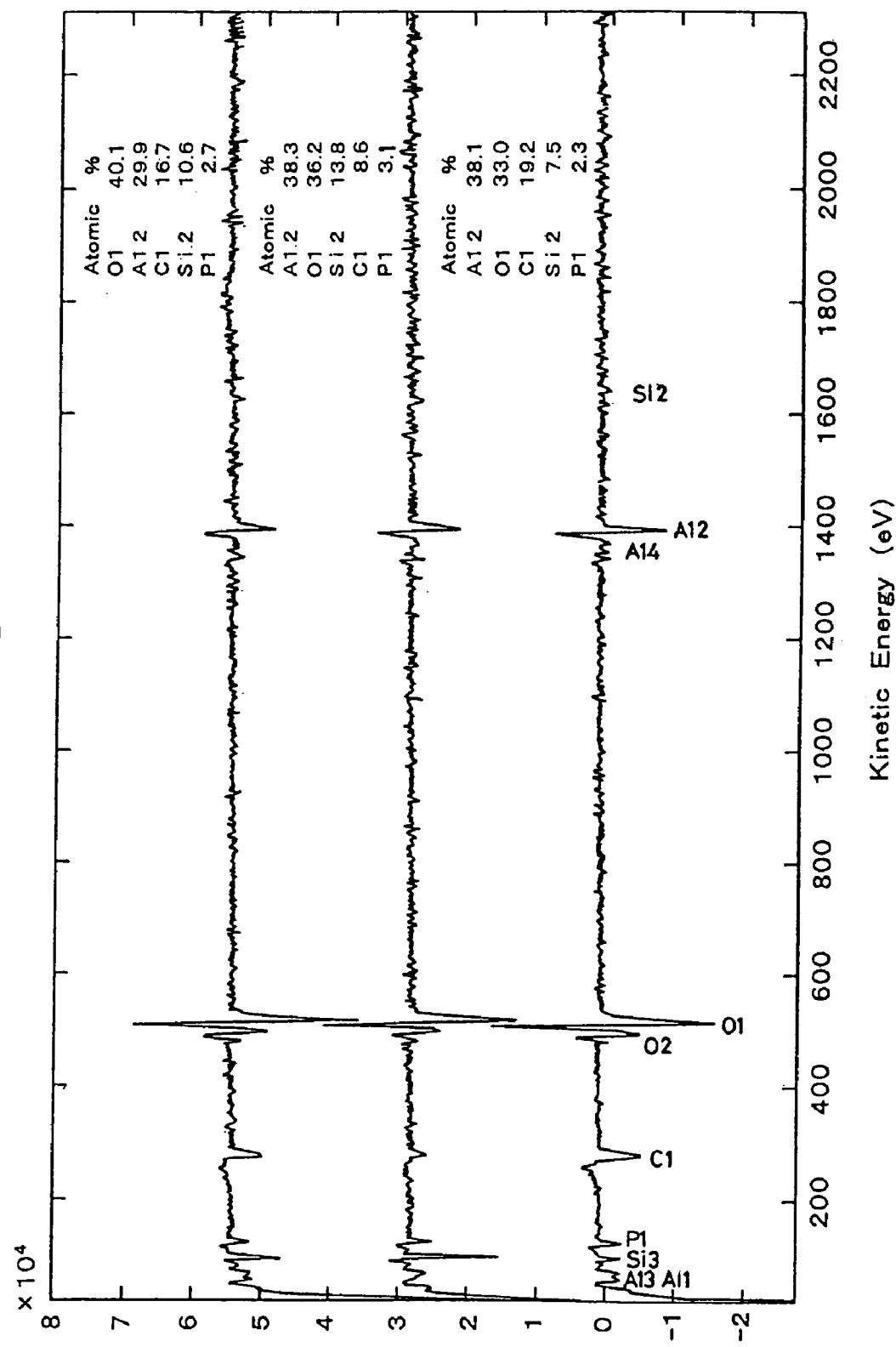
FIG. 8 shows a spectral diagram showing a result of measurement by field emission Auger electron spectroscopy.
Figure 9A:
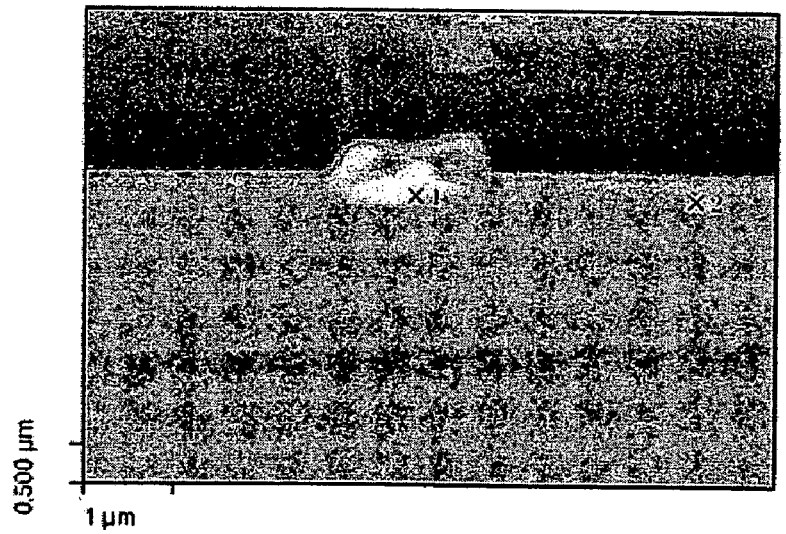
FIGS. 9A and 9B are SEM images of a semiconductor laser.
Figure 9B:
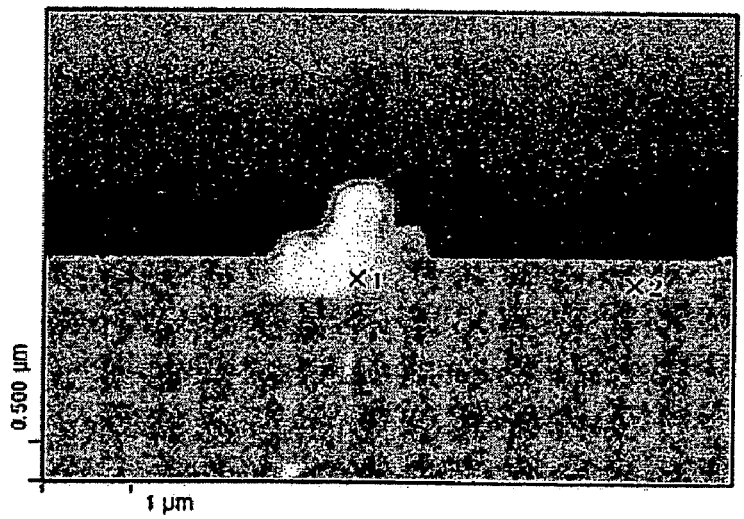

FIG. 8 shows a result of the measurement by field emission Auger electron spectroscopy. FIG. 9 shows an image by scanning electron microscopy (SEM) showing the position where the spectrum was measured. The Inventor next conducted identification by comparing spectrums at the position of the deposit and other positions without deposits. The position where the deposit exists is the active layer, i.e. the light emitting portion, which corresponds to the position of the laser stripe. At this position, Si and O were detected. No Al in the base portion was detected. It was confirmed from these facts that both Si and O were matters formed on the base, that is, they were deposits. On the other hand, at other positions apart from the light emitting portion, where no deposits exist, componential elements, Al and O, of alumina as the base were detected, and Si was detected as well. However, the spectrums from silicon with the deposit and spectrums from silicon without deposits were different. Spectrums from the portion with the deposits were broad, and the peak position and shape were offset. This is the spectral profile reflecting so-called chemical shifting, which demonstrates that silicon is the compound. In the portion without deposits, it was confirmed that the spectrums were narrow and that it was metallic from the peak position. That is, it is considered Si having diffused after decomposition. Since the detection sensitivity of field emission Auger electron spectroscopy is several electron layers (~3 nm), it is not strange that the image cannot be observed by either SEM or TEM.

Furthermore, the Inventor prepared samples including organic compounds other than the above-mentioned ultraviolet-setting epoxy adhesive coated inside CAN packages. These samples were subjected to a drive current fluctuation test and analysis of componential elements of deposits.

Table 1 shows kinds and curing modes of base polymers of organic compounds coated inside CAN packages, a result of their drive current fluctuation test, and a result of the componential analysis. In Table 1, some of samples exhibiting periodical changes in drive current were checked with ●.

TABLE 1

| Base polymer | Mode of curing reaction | Drive current fluctuation test | Main components of deposit |
|---|---|---|---|
| Metamorphic acrylate 1 | UV-setting | ● | SiOx |
| Epoxy 1 | UV-setting | ● | SiOx |
| Epoxy 2 | UV-thermosetting | ● | SiOx |
| Epoxy 3 | B stage | ● | SiOx |
| Mold Matrix 3 | New HD mold | ● | SiOx |
| Ag paste 1 | Thermosetting | ● | SiOx |
| Ag paste 2 | Thermosetting | ● | SiOx |

It is noted from Table 1 that all samples exhibits periodical fluctuation caused by deposits. It is also noted that Si and O are main components of the deposits.

The Inventor next carried out componential analysis of gas generated from organic adhesives by gas chromatography mass-spectroscopy (GC-MS) and time of flight-secondary ion mass spectroscopy (TOF-SIMS). Through this analysis, the Inventor recognized that the generated gas contains Si organic compounds such as siloxane, silane, and the like.

Organic adhesives used in those samples have been used in conventional CAN package light emitting devices, etc. incorporating 780 nm band and 650 nm band semiconductor lasers. However, in conventional semiconductor lasers, deterioration caused by formation of the above-mentioned deposits has not been remarked.

Through the above-explained examination, when a 405 nm band GaN semiconductor laser is housed and driven in a CAN package, the Inventor has found the following matters.

(1) Deterioration caused by a deposit formed on the light emitting portion is observed.

(2) The reactive substance is a Si organic compound gas.

(3) Energy source of reaction is light.

(4) The deposit contains Si and O as its major components.

The light-induced reaction is a phenomenon not found in conventional 790 nm band AlGaAs compound semiconductor lasers and 650 nm band AlGaInP compound semiconductors.

The Inventor next prepared samples with previously formed resins located in similar positions in lieu of adhesives, and carried out similar test and measurements. Thus, the Inventor confirmed that deposits were formed on edges of semiconductor lasers and that the lasers exhibited similar deterioration. Although the organic adhesives and previously formed resins are different in intended use and form, they are common in terms of material, and they both are made of organic polymers. In view of their materials, it will be reasonable to consider that both deterioration caused by organic adhesives and deterioration caused by previously formed resins derive from the same mechanism.

For light-induced reaction to occur, it is necessary for molecules of Si organic compound gas to decompose accompanying absorption of light. However, energy of a photon having the wavelength of 405 nm is approximately 3.0 eV, and this energy value is insufficient for decomposition of Si organic compound gas molecules.

Taking it into consideration, the Inventor imagined a multi-photon reaction model. By comparing the thickness of the deposit derived from this model with the thickness of the deposit actually obtained from the TEM image, the Inventor examines adequacy of this propositional model. Explained below is a multi-photon reaction model.

Figure 10:
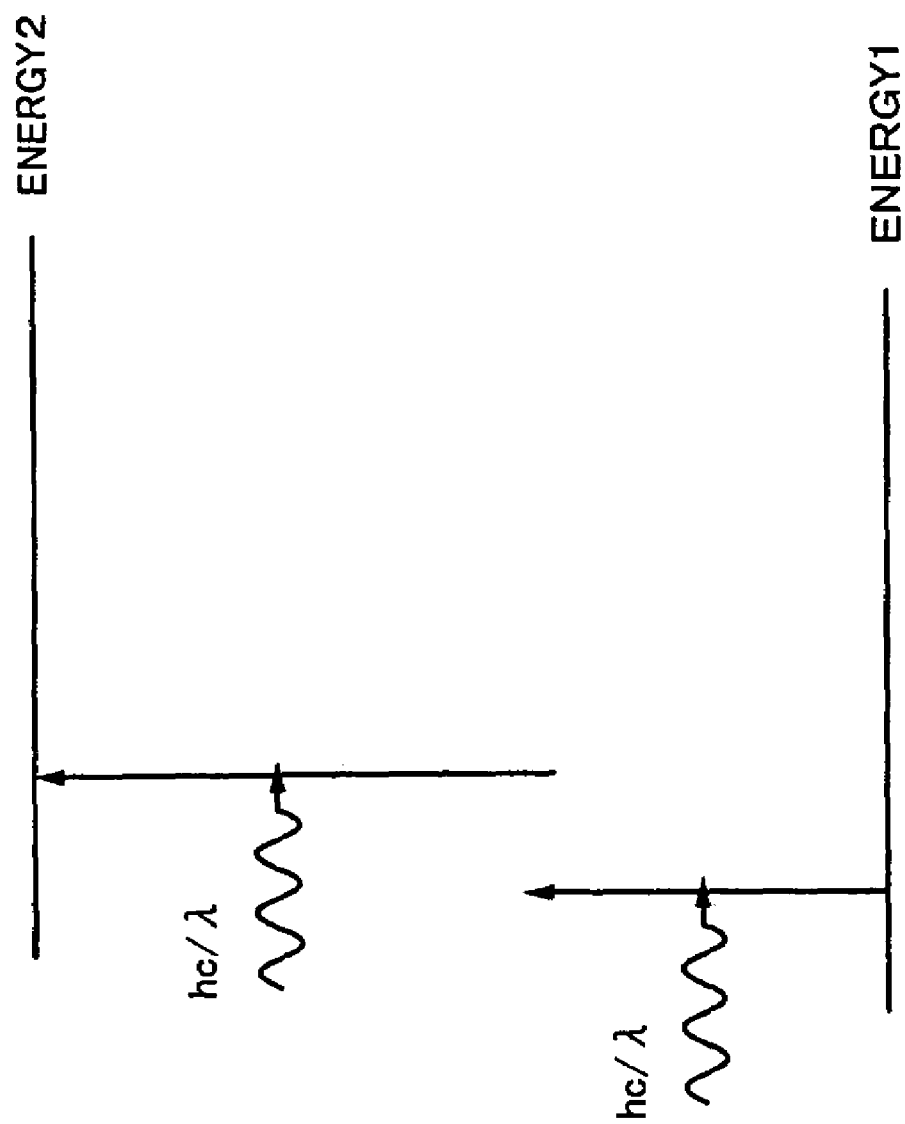
FIG. 10 is a schematic diagram for explaining a multiphoton reaction model.

FIG. 10 is a diagram for explaining the multi-photon reaction model. In FIG. 10, reaction by two photon absorptions is shown for convenience. Once a molecule of Si organic compound gas absorbs a plurality of photons having the wavelength $\lambda$, the energy of an electron system in the molecule is excited from the energy level $E_1$ to the energy level $E_2$.

Taking account of the light-induced reaction and the reaction of Si-induced compound gas, the number of depositing elements per unit time can be expressed by:

$$\text{Number of deposited elements} = A \times (\text{number of photons})^n \times (\text{number of gas molecules}) \quad (2)$$

where A is a coefficient and n is a constant. The constant n represents how many photons take part in the reaction.

For deposition of the deposit on an edge of a semiconductor laser, the bond of a molecule of Si organic compound gas must be broken. However, considering the bonding energy, it is difficult for one photon having the wavelength of 405 nm to break the bond of a molecule of Si organic compound gas. Although its possibility is not zero, it will be extremely unlikely to occur. In contrast, when multi-photon reaction is assumed, the photon energy is multiplied by n, and it will become easier to break the bond.

If the multi-photon reaction occurs in a micro area dS on an edge of the semiconductor laser, number of depositing elements, number of photons and number of gas molecules can be expressed by the following equations.

$$\text{Number of depositing elements} = (\text{thickness of deposition} \times dS) \times \text{density} \quad (3)$$

$$\text{Number of photons} = \text{density of photons} \times \text{speed of light} \times dS \quad (4)$$

$$\text{Number of gas molecules} = n\text{org} \times v\text{org} \times dS \quad (5)$$

where norg is the density of Si organic compound gas and Vorg is the mean velocity of Si organic compound gas.

When Equation (2) is substituted by Equations (3) to (5), thickness of deposition per unit time is given by:

$$\text{Deposition thickness/time} = \quad (6)$$
$$A' \times [\text{photon density} \times \text{speed of light} \times dS]^n \times (n\text{org} \times v\text{org})$$

The photon density can be expressed as:

$$P0/(c \cdot S)/(h \cdot c/\lambda) \quad (7)$$

where P0 is output of the semiconductor laser, c is the speed of light, S is the emission area, h is the Compton constant, and $\lambda$ is the wavelength.

Therefore, Equation (6) becomes:

$$\text{Deposition thickness/time} = A' \times [(P0 \cdot \lambda)/(hc) \cdot (dS/S)]^n \times (n\text{org} \times v\text{org}) \quad (8)$$

A' is regarded the result of dividing the effective deposition probability depending upon the wavelength $\lambda$ of light (probability combining decomposition, adhesion and elimination) by the effective density of the deposit SiOx.

If the Si organic compound gas is regarded as approximately ideal gas, then the following equation is valid.

$$P\text{org} \times V = N\text{org } k_B T \quad (9)$$

Further, the following equation is valid from an elastic collision model.

$$P\text{org} = N\text{org} \times (m \times v\text{org}^2)/(3V) \quad (10)$$

where V is the volume, Norg is the number of gas molecules, and norg=Norg/V

Therefore, Equation (8) can be expressed as:

$$\text{Deposition thickness/time} = \quad (11)$$
$$A' \times [(P0 \cdot \lambda)/(hc) \cdot (dS/S)]^n \times (P\text{org}) \cdot (3/mk_B T)^{0.5}$$

where m is the mass of gas molecules, and Porg is the gas pressure.

Value of n is next derived from the thickness of the deposit formed on the edge of the semiconductor laser observed by the instant test and the theoretical equation shown above. Thickness of the deposit and the laser output P0 vary depending on the position. Therefore, thickness of the deposit and the laser output P0 are expressed below by using a variable y. Here is regarded the depositing direction of the deposit on the semiconductor laser, i.e. the vertical direction of the transversal mode, as the y direction. In this case, the origin of the y direction is put at the midpoint of the quantum-well active layer. This setting of the origin point does not influence the examinations heretofore made and later examinations.

When the coordinates are determined as mentioned above, there are the following relations.

$$\text{Deposition thickness} \rightarrow \text{Deposition thickness (y)} \quad (12)$$

$$P0 \rightarrow P0(y) \quad (13)$$

P0(y) can be normalized by peak intensity of the semiconductor laser and Pmax as follows.

$$P0(y) = P\text{max} \cdot P\text{renorm}(y) \quad (14)$$

Therefore, Equation (11) is rewritten as follows.

$$\text{Deposition thickness}(y)/\text{time} = \quad (15)$$
$$A' \times [(P\text{max} \cdot P\text{renorm}(y) \cdot \lambda)/(hc) \cdot (dS/S)]^n \times (P\text{org}) \cdot (3/mk_B T)^{0.5}$$

Prenorm(y) was derived by determining the light field at the position of an LD cavity edge by LD cavity simulation using the equivalent refractive index method and introducing diffraction effects in the edge coat where the waveguide structure does not exist. Fresnel diffraction was assumed as the diffraction. If the result of the LD waveguide simulation is converted by Fraunhofer diffraction, the far field pattern, which is one of laser characteristics, can be calculated. The full width at half maximum obtained by the calculation was 20.6°, but the actually measured value was 20.1°. In this manner, preciseness of the light intensity profile in the waveguide can be examined.

Figure 11:
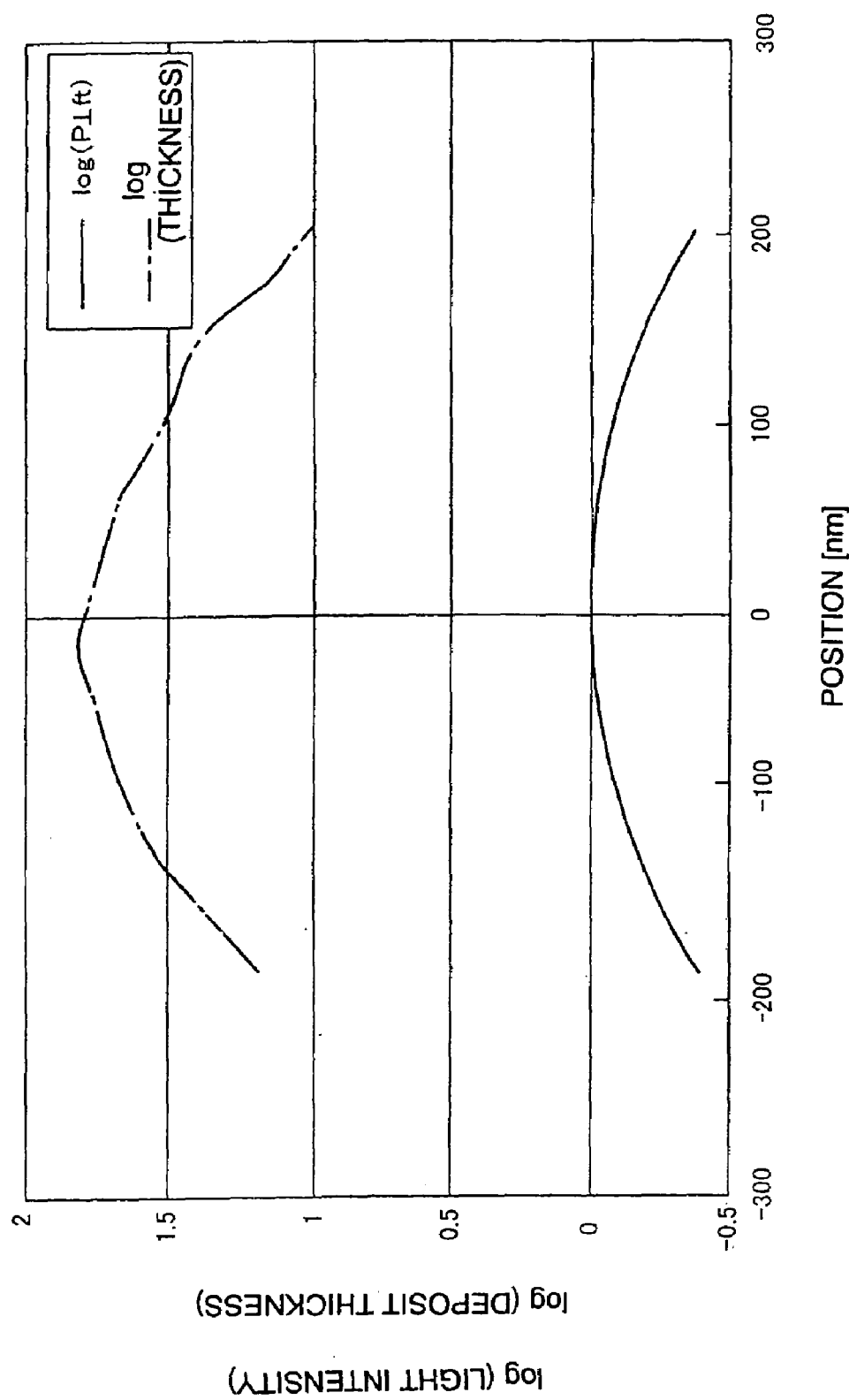
FIG. 11 is a graph showing correlation between light intensity profile and deposit thickness profile.
Figure 12:
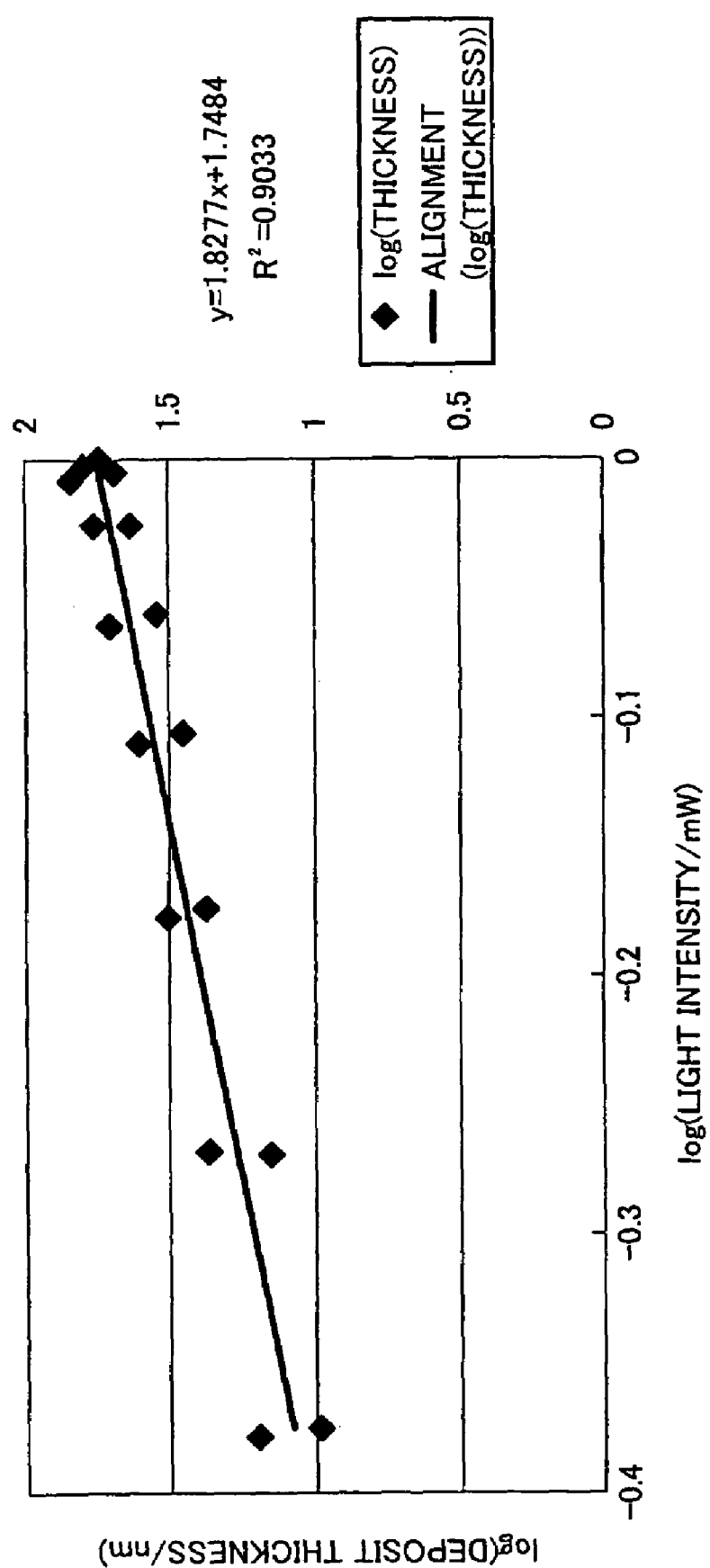
FIG. 12 is a graph showing relation between light intensity profile and deposit thickness profile.

To clarify the correlation between the light intensity and the deposit formed on the edge of the semiconductor laser, the Inventor next measured thickness of the deposit formed on the edge of the semiconductor laser, and examined relations between the thickness of the deposit and the light intensity (normalized light intensity). FIG. 11 shows light intensity and thickness of the deposit relative to the position. FIG. 12 shows relations between light intensity and thickness of the deposit.

As shown in FIG. 12, relations between light intensity and deposition thickness can be expressed by: straight line y=1.8277x+1.7484 where y=log (deposition thickness), and x=log (light intensity). Value of inclination of the straight line y is 1.8277. This demonstrates that generation of the deposit is the phenomenon in which approximately two photons take part.

From FIG. 12, the following values can be obtained as values of n and A'.

$$n=1.8277 \quad (16)$$

$$A'=7.91\times 10^{-60} \quad (17)$$

Tables 2 and 3 show values of parameters, segment of the straight line shown in FIG. 12, and so forth. Note that the gas pressure Porg is the value obtained by TOF-SIMS and GC-MS.

TABLE 2

| | |
|---|---|
| h [Js] | $6.62 \times 10^{-34}$ |
| c [m/2] | $3.00 \times 10^{8}$ |
| λ [m] | $4.05 \times 10^{-7}$ |
| $k_B$ [J/K] | $1.38 \times 10^{-23}$ |
| NA | $6.02 \times 10^{23}$ |
| T [K] | 333 |
| Aging time [s] | 2394000 |
| M | 147 |
| Po [mW] | 30 |
| m [Kg] | $2.24 \times 10^{-25}$ |
| Pmax [W] | $9.09 \times 10^{-5}$ |
| dS [$m^2$] | $1.80 \times 10^{-8}$ |
| S [$m^2$] | $1.18 \times 10^{-6}$ |
| Porg [N/$m^2$] | $1.01 \times 10^{0}$ |

TABLE 3

| | |
|---|---|
| n | 1.8277 |
| Segment | -7.2516 |
| Log(A) | -59.108 |
| A[$m^3$/s] | $7.81 \times 10^{-60}$ |

From these results, the reaction can be confirmed to be multi-photon reaction process, and in this case, two-photon reaction process. It will be needless to say that n is theoretically an integer but, in general, actually observable values, in general, are not integers because of the measurement accuracy and results of reactions of other components.

As a result of the foregoing examination, the following matters have been clarified.

(1) Deposition on edges occurs while the 405 nm band semiconductor laser is driven.

(2) Reaction takes place when Si organic compound gas exists.

(3) This is a deterioration mechanism in lasers of other materials, i.e. semiconductor lasers for other wavelengths.

(3) Deterioration is reaction induced by light of 405 nm band and followed by decomposition of Si organic compound.

(4) Two-photon absorption process is dominant among light reactions, and the resultant energy causes decomposition of the Si organic compound.

As explained above, the Inventor could elucidate the mechanism of the deterioration phenomenon of semiconductor lasers. Characteristics deterioration caused by multi-photon reaction, thus clarified, has not been remarked in semiconductor lasers heretofore used practically. This is probably because the reaction probability A' has been small. In recent years, however, enhancement of semiconductor lasers in power is under progress, and these semiconductor lasers are accompanied by the above-explained deterioration phenomenon by multi-photon reaction. Therefore, it will be needless to say that the present in invention is applicable to semiconductors emitting laser light having any wavelength other than 405 nm.

To alleviate the above-discussed deterioration, it is necessary to limit the amount of Si-induced compound gas in the package to or below a predetermined value. In Equation (15), if the time is the guaranteed time of proper operation, acceptable thickness of the deposit is ¼ of λ, output of the semiconductor laser is the mean optical output on the edge, and the reaction area dS is the emission area; then Equation (5) can be expressed as:

$$\lambda/(4\times\text{refractive index})/\text{guaranteed operation time} > \quad (18)$$
$$A' \times [(\text{optical output}\cdot\lambda)/(hc)]^n \times$$
$$(\text{Si organic compound gas pressure})\cdot(3/mk_BT)^{0.5}$$

Based on this Equation (18), the present invention intends to limit the vapor pressure of Si organic compound gas and thereby suppress characteristics deterioration of a semiconductor laser caused by formation of a deposit.

Thus, the present invention has been made based on the above-discussed researches and examination. Some embodiments of the invention will now be explained below with reference to the drawings. FIG. 12 shows an exemplary configuration of a CAN package light emitting device according to an embodiment of the invention.

As shown in FIG. 13, the CAN package light emitting device according to the embodiment comprises a semiconductor laser 1 bonded on a sub mount 6, and a CAN package 2 for housing the semiconductor laser 1 bonded to the sub mount 6. The CAN package 2 is composed of a fixing structure 3 for fixing the semiconductor laser 1 in place, and a cap 4 covering the semiconductor laser 1 fixed by the fixing structure 3.

The fixing structure 3 has a disc-like shape, and it is made of a metal such as Fe, Cu, or the like. On one major surface of the fixing structure 3, a heat sink 5 is provided. The heat sink 5 is made of an electrically conductive material such as Fe, Cu, or the like, and its surface is coated with Au coat, for example. The sub mount 6 is bonded on the heat sink 5. The sub mount 6 is made of Si or AlN, for example. The semiconductor laser 1 is bonded on the sub mount 6. The semiconductor laser 1 is a group III nitride compound semiconductor laser like a GaN/GaInN semiconductor laser configured to emit laser light of wavelengths 395 nm to 415 nm for example, or more specifically, laser light of the wavelength 405 nm for example.

The fixing structure has three lead pins 7a, 7b and 7c passing through the fixing structure 3. The lead pin 7a is electrically connected to the heat sink 5. The lead pin 7b is connected to the sub mount y by wire 8. The wire 8 is made of an electrically conductive material such as Au for example. Between the lead pins 7b, 7c and the fixing structure 3, spacers of glass having a low melting point is interposed to insulate the lead pins 7b, 7c from the fixing structure 3 and prevent air from entering into the CAN package 2. These lead pins 7b, 7c are made of an electrically conductive material such as Fe or Cu, for example.

The cap 4 has a cylindrical form closed at one end. It is made of a metal such as Fe for example, and is surface is plated with Cr for example. The open end of the cap 4 is bonded to the fixing structure 3, and the opposite end of the cap 4 has a light-extracting portion 9 permitting extraction of laser light emitted from the semiconductor laser 1. The light-extracting portion 9 has a circular form, and it is covered with seal glass 10 of glass containing molten quartz having a high transmittance as its matrix. The seal grass 10 is preferably coated by a non-reflective coat.

Vapor pressure of Si organic compound gas in the CAN package 2 is limited to and below a predetermined value, e.g. $4 \times 10^2 \text{N/m}^2$ according to Equation (18). To cope with the requirement of 30 mW as the laser optical output during standard speed recording compliant with the next-generation high-density optical discs (Blu-ray Discs) and to guarantee 1000 hours of proper operation, the vapor pressure is preferably limited to and below $8.02 \times 10^{-1}$ N/m². To cope with the requirement of 300 mW as the laser optical output during double-speed recording and to guarantee 100 hours of proper operation, the vapor pressure is preferably limited to and below $1.2 \times 10^{-2}$ N/m².

Shown below are upper limits of the vapor pressure of Si organic compound gas calculated from Equation (18). Table 4 shows the upper limit of the vapor pressure and parameters used for the calculation in case the wavelength of the laser light is 395 nm and the optical output of the laser is 3 mW. Table 5 shows the upper limit of the vapor pressure and parameters used for the calculation in case the wavelength of the laser light is 405 nm and the optical output of the laser is 3 mW. Table 6 shows the upper limit of the vapor pressure and parameters used for the calculation in case the wavelength of the laser light is 415 nm and the optical output of the laser is 3 mW.

TABLE 4

| | | | |
|---|---|---|---|
| $\lambda$ [m] | $3.95 \times 10^{-7}$ | dcr [m] | $6.37 \times 10^{-8}$ |
| n | 1.55 | tcr [sec] | 360000 |
| M | 147 | m [g] | $2.44 \times 10^{-25}$ |
| Guaranteed time [h] | 100 | Pmax | $9.09 \times 10^{-6}$ |
| Po [mW] | 3 | $[P_{LD}\lambda/hc * dS/S]^n$ | $8.13 \times 10^{20}$ |
| T [K] | 333 | $(3/mk_BT)^{0.5}$ | $5.17 \times 10^{22}$ |
| dS [m²] | $1.80 \times 10^{-8}$ | Porg [N/m²] | $5.39 \times 10^2$ |
| S [m²] | $1.18 \times 10^{-6}$ | Porg [atm] | $5.39 \times 10^{-3}$ |

TABLE 5

| | | | |
|---|---|---|---|
| $\lambda$ [m] | $4.05 \times 10^{-7}$ | dcr [m] | $6.53 \times 10^{-8}$ |
| n | 1.55 | tcr [sec] | 360000 |
| M | 147 | m [g] | $2.44 \times 10^{-25}$ |
| Guaranteed time [h] | 100 | Pmax | $9.09 \times 10^{-6}$ |
| Po [mW] | 3 | $[P_{LD}\lambda/hc * dS/S]^n$ | $8.51 \times 10^{20}$ |
| T [K] | 333 | $(3/mk_BT)^{0.5}$ | $5.17 \times 10^{22}$ |
| dS [m²] | $1.80 \times 10^{-8}$ | Porg [N/m²] | $5.28 \times 10^2$ |
| S [m²] | $1.18 \times 10^{-6}$ | Porg [atm] | $5.28 \times 10^{-3}$ |

TABLE 6

| | | | |
|---|---|---|---|
| $\lambda$ [m] | $4.15 \times 10^{-7}$ | dcr [m] | $6.69 \times 10^{-8}$ |
| n | 1.55 | tcr [sec] | 360000 |
| M | 147 | m [g] | $2.44 \times 10^{-25}$ |
| Guaranteed time [h] | 100 | Pmax | $9.09 \times 10^{-6}$ |
| Po [mW] | 3 | $[P_{LD}\lambda/hc * dS/S]^n$ | $8.90 \times 10^{20}$ |
| T [K] | 333 | $(3/mk_BT)^{0.5}$ | $5.17 \times 10^{22}$ |
| dS [m²] | $1.80 \times 10^{-8}$ | Porg [N/m²] | $5.18 \times 10^2$ |
| S [m²] | $1.18 \times 10^{-6}$ | Porg [atm] | $5.18 \times 10^{-3}$ |

It is appreciated from Tables 4, 5 and 6 that, when the wavelength of the laser light is in the range from 395 nm to 415 nm and the optical output of the laser is equal to or lower than 3 mW, characteristics deterioration of the CAN package light emitting device within 100 hours as the minimum guaranteed operation time for practical use can be prevented by limiting the vapor pressure of Si organic compound gas in the package to and below $5.18 \times 10^2$ N/m².

Table 7 shows the upper limit of the vapor pressure and parameters used for the calculation in case the wavelength of the laser light is 395 nm and the optical output of the laser is 30 mW. Table 8 shows the upper limit of the vapor pressure and parameters used for the calculation in case the wavelength of the laser light is 405 nm and the optical output of the laser is 30 mW. Table 9 shows the upper limit of the vapor pressure and parameters used for the calculation in case the wavelength of the laser light is 415 nm and the optical output of the laser is 30 mW.

TABLE 7

| | | | |
|---|---|---|---|
| $\lambda$ [m] | $3.95 \times 10^{-7}$ | dcr [m] | $6.37 \times 10^{-8}$ |
| n | 1.55 | tcr [sec] | 360000 |
| M | 147 | m [g] | $2.44 \times 10^{-25}$ |
| Guaranteed time [h] | 100 | Pmax | $9.09 \times 10^{-5}$ |
| Po [mW] | 30 | $[P_{LD}\lambda/hc * dS/S]^n$ | $5.47 \times 10^{22}$ |
| T [K] | 333 | $(3/mk_BT)^{0.5}$ | $5.17 \times 10^{22}$ |
| dS [m²] | $1.80 \times 10^{-8}$ | Porg [N/m²] | $8.02 \times 10^0$ |
| S [m²] | $1.18 \times 10^{-6}$ | Porg [atm] | $8.02 \times 10^{-5}$ |

TABLE 8

| | | | |
|---|---|---|---|
| $\lambda$ [m] | $4.05 \times 10^{-7}$ | dcr [m] | $6.53 \times 10^{-8}$ |
| n | 1.55 | tcr [sec] | 360000 |
| M | 147 | m [g] | $2.44 \times 10^{-25}$ |
| Guaranteed time [h] | 100 | Pmax | $9.09 \times 10^{-5}$ |
| Po [mW] | 30 | $[P_{LD}\lambda/hc * dS/S]^n$ | $5.72 \times 10^{22}$ |
| T [K] | 333 | $(3/mk_BT)^{0.5}$ | $5.17 \times 10^{22}$ |
| dS [m²] | $1.80 \times 10^{-8}$ | Porg [N/m²] | $7.86 \times 10^0$ |
| S [m²] | $1.18 \times 10^{-6}$ | Porg [atm] | $7.86 \times 10^{-5}$ |

TABLE 9

| | | | |
|---|---|---|---|
| $\lambda$ [m] | $4.15 \times 10^{-7}$ | dcr [m] | $6.69 \times 10^{-8}$ |
| n | 1.55 | tcr [sec] | 360000 |
| M | 147 | m [g] | $2.44 \times 10^{-25}$ |
| Guaranteed time [h] | 100 | Pmax | $9.09 \times 10^{-5}$ |
| Po [mW] | 30 | $[P_{LD}\lambda/hc * dS/S]^n$ | $5.98 \times 10^{22}$ |
| T [K] | 333 | $(3/mk_BT)^{0.5}$ | $5.17 \times 10^{22}$ |
| dS [m²] | $1.80 \times 10^{-8}$ | Porg [N/m²] | $7.70 \times 10^0$ |
| S [m²] | $1.18 \times 10^{-6}$ | Porg [atm] | $7.70 \times 10^{-5}$ |

It is appreciated from Tables 7, 8 and 9 that, when the wavelength of the laser light is in the range from 395 nm to 415 nm and the optical output of the laser is equal to or lower than 30 mW, characteristics deterioration of the CAN package light emitting device within 100 hours as the minimum guaranteed operation time for practical use can be prevented by limiting the vapor pressure of Si organic compound gas in the package to and below 7.70 N/m².

Table 10 shows the upper limit of the vapor pressure and parameters used for the calculation in case the wavelength of the laser light is 395 nm and the optical output of the laser is 300 mW. Table 11 shows the upper limit of the vapor pressure and parameters used for the calculation in case the wavelength of the laser light is 405 nm and the optical output of the laser is 300 mW. Table 12 shows the upper limit of the vapor pressure and parameters used for the calculation in case the wavelength of the laser light is 415 nm and the optical output of the laser is 300 mW.

TABLE 10

| | | | |
|---|---|---|---|
| $\lambda$ [m] | $3.95 \times 10^{-7}$ | dcr [m] | $6.37 \times 10^{-8}$ |
| n | 1.55 | tcr [sec] | 360000 |
| M | 147 | m [g] | $2.44 \times 10^{-25}$ |
| Guaranteed time [h] | 100 | Pmax | $9.09 \times 10^{-4}$ |
| Po [mW] | 300 | $[P_{LD}\lambda/hc * dS/S]^n$ | $3.68 \times 10^{24}$ |
| T [K] | 333 | $(3/mk_BT)^{0.5}$ | $5.17 \times 10^{22}$ |
| dS [m$^2$] | $1.80 \times 10^{-8}$ | Porg [N/m$^2$] | $1.19 \times 10^{-1}$ |
| S [m$^2$] | $1.18 \times 10^{-6}$ | Porg [atm] | $1.19 \times 10^{-6}$ |

TABLE 11

| | | | |
|---|---|---|---|
| $\lambda$ [m] | $4.05 \times 10^{-7}$ | dcr [m] | $6.53 \times 10^{-8}$ |
| n | 1.55 | tcr [sec] | 360000 |
| M | 147 | m [g] | $2.44 \times 10^{-25}$ |
| Guaranteed time [h] | 100 | Pmax | $9.09 \times 10^{-4}$ |
| Po [mW] | 300 | $[P_{LD}\lambda/hc * dS/S]^n$ | $3.85 \times 10^{24}$ |
| T [K] | 333 | $(3/mk_BT)^{0.5}$ | $5.17 \times 10^{22}$ |
| dS [m$^2$] | $1.80 \times 10^{-8}$ | Porg [N/m$^2$] | $1.17 \times 10^{-1}$ |
| S [m$^2$] | $1.18 \times 10^{-6}$ | Porg [atm] | $1.17 \times 10^{-6}$ |

TABLE 12

| | | | |
|---|---|---|---|
| $\lambda$ [m] | $4.15 \times 10^{-7}$ | dcr [m] | $6.69 \times 10^{-8}$ |
| n | 1.55 | tcr [sec] | 360000 |
| M | 147 | m [g] | $2.44 \times 10^{-25}$ |
| Guaranteed time [h] | 100 | Pmax | $9.09 \times 10^{-4}$ |
| Po [mW] | 300 | $[P_{LD}\lambda/hc * dS/S]^n$ | $4.02 \times 10^{24}$ |
| T [K] | 333 | $(3/mk_BT)^{0.5}$ | $5.17 \times 10^{22}$ |
| dS [m$^2$] | $1.80 \times 10^{-8}$ | Porg [N/m$^2$] | $1.14 \times 10^{-1}$ |
| S [m$^2$] | $1.18 \times 10^{-6}$ | Porg [atm] | $1.14 \times 10^{-6}$ |

It is appreciated from Tables 10, 11 and 12 that, when the wavelength of the laser light is in the range from 395 nm to 415 nm and the optical output of the laser is equal to or lower than 300 mW, characteristics deterioration of the CAN package light emitting device within 100 hours as the minimum guaranteed operation time for practical use can be prevented by limiting the vapor pressure of Si organic compound gas in the package to and below $1.14 \times 10^{-1}$ N/m$^2$.

Table 13 shows the upper limit of the vapor pressure and parameters used for the calculation in case the wavelength of the laser light is 395 nm and the optical output of the laser is 3 mW. Table 14 shows the upper limit of the vapor pressure and parameters used for the calculation in case the wavelength of the laser light is 405 nm and the optical output of the laser is 3 mW. Table 15 shows the upper limit of the vapor pressure and parameters used for the calculation in case the wavelength of the laser light is 415 nm and the optical output of the laser is 3 mW.

TABLE 13

| | | | |
|---|---|---|---|
| $\lambda$ [m] | $3.95 \times 10^{-7}$ | dcr [m] | $6.37 \times 10^{-8}$ |
| n | 1.55 | tcr [sec] | 3600000 |
| M | 147 | m [g] | $2.44 \times 10^{-25}$ |
| Guaranteed time [h] | 1000 | Pmax | $9.09 \times 10^{-6}$ |

TABLE 13-continued

| | | | |
|---|---|---|---|
| Po [mW] | 3 | $[P_{LD}\lambda/hc * dS/S]^n$ | $8.13 \times 10^{20}$ |
| T [K] | 333 | $(3/mk_BT)^{0.5}$ | $5.17 \times 10^{22}$ |
| dS [m$^2$] | $1.80 \times 10^{-8}$ | Porg [N/m$^2$] | $5.39 \times 10^{1}$ |
| S [m$^2$] | $1.18 \times 10^{-6}$ | Porg [atm] | $5.39 \times 10^{-4}$ |

TABLE 14

| | | | |
|---|---|---|---|
| $\lambda$ [m] | $4.05 \times 10^{-7}$ | dcr [m] | $6.53 \times 10^{-8}$ |
| n | 1.55 | tcr [sec] | 3600000 |
| M | 147 | m [g] | $2.44 \times 10^{-25}$ |
| Guaranteed time [h] | 1000 | Pmax | $9.09 \times 10^{-6}$ |
| Po [mW] | 3 | $[P_{LD}\lambda/hc * dS/S]^n$ | $8.51 \times 10^{20}$ |
| T [K] | 333 | $(3/mk_BT)^{0.5}$ | $5.17 \times 10^{22}$ |
| dS [m$^2$] | $1.80 \times 10^{-8}$ | Porg [N/m$^2$] | $5.28 \times 10^{1}$ |
| S [m$^2$] | $1.18 \times 10^{-6}$ | Porg [atm] | $5.28 \times 10^{-4}$ |

TABLE 15

| | | | |
|---|---|---|---|
| $\lambda$ [m] | $4.15 \times 10^{-7}$ | dcr [m] | $6.69 \times 10^{-8}$ |
| n | 1.55 | tcr [sec] | 3600000 |
| M | 147 | m [g] | $2.44 \times 10^{-25}$ |
| Guaranteed time [h] | 1000 | Pmax | $9.09 \times 10^{-6}$ |
| Po [mW] | 3 | $[P_{LD}\lambda/hc * dS/S]^n$ | $8.90 \times 10^{20}$ |
| T [K] | 333 | $(3/mk_BT)^{0.5}$ | $5.17 \times 10^{22}$ |
| dS [m$^2$] | $1.80 \times 10^{-8}$ | Porg [N/m$^2$] | $5.18 \times 10^{1}$ |
| S [m$^2$] | $1.18 \times 10^{-6}$ | Porg [atm] | $5.18 \times 10^{-4}$ |

It is appreciated from Tables 13, 14 and 15 that, when the wavelength of the laser light is in the range from 395 nm to 415 nm and the optical output of the laser is equal to or lower than 3 mW, characteristics deterioration of the CAN package light emitting device within 1000 hours as the preferably required guaranteed operation time for practical use can be prevented by limiting the vapor pressure of Si organic compound gas in the package to and below $5.18 \times 10$ N/m$^2$.

Table 16 shows the upper limit of the vapor pressure and parameters used for the calculation in case the wavelength of the laser light is 395 nm and the optical output of the laser is 30 mW. Table 17 shows the upper limit of the vapor pressure and parameters used for the calculation in case the wavelength of the laser light is 405 nm and the optical output of the laser is 30 mW. Table 18 shows the upper limit of the vapor pressure and parameters used for the calculation in case the wavelength of the laser light is 415 nm and the optical output of the laser is 30 mW.

TABLE 16

| | | | |
|---|---|---|---|
| $\lambda$ [m] | $3.95 \times 10^{-7}$ | dcr [m] | $6.37 \times 10^{-8}$ |
| n | 1.55 | tcr [sec] | 3600000 |
| M | 147 | m [g] | $2.44 \times 10^{-25}$ |
| Guaranteed time [h] | 1000 | Pmax | $9.09 \times 10^{-6}$ |
| Po [mW] | 30 | $[P_{LD}\lambda/hc * dS/S]^n$ | $5.47 \times 10^{22}$ |
| T [K] | 333 | $(3/mk_BT)^{0.5}$ | $5.17 \times 10^{22}$ |
| dS [m$^2$] | $1.80 \times 10^{-8}$ | Porg [N/m$^2$] | $8.02 \times 10^{-1}$ |
| S [m$^2$] | $1.18 \times 10^{-6}$ | Porg [atm] | $8.02 \times 10^{-6}$ |

TABLE 17

| | | | |
|---|---|---|---|
| $\lambda$ [m] | $4.05 \times 10^{-7}$ | dcr [m] | $6.53 \times 10^{-8}$ |
| n | 1.55 | tcr [sec] | 3600000 |
| M | 147 | m [g] | $2.44 \times 10^{-25}$ |
| Guaranteed time [h] | 1000 | Pmax | $9.09 \times 10^{-6}$ |
| Po [mW] | 30 | $[P_{LD}\lambda/hc * dS/S]^n$ | $5.72 \times 10^{22}$ |
| T [K] | 333 | $(3/mk_BT)^{0.5}$ | $5.17 \times 10^{22}$ |
| dS [m$^2$] | $1.80 \times 10^{-8}$ | Porg [N/m$^2$] | $7.86 \times 10^{-1}$ |
| S [m$^2$] | $1.18 \times 10^{-6}$ | Porg [atm] | $7.86 \times 10^{-6}$ |

TABLE 18

| | | | |
|---|---|---|---|
| λ [m] | 4.15 × 10⁻⁷ | dcr [m] | 6.69 × 10⁻⁸ |
| n | 1.55 | tcr [sec] | 3600000 |
| M | 147 | m [g] | 2.44 × 10⁻²⁵ |
| Guaranteed time [h] | 1000 | Pmax | 9.09 × 10⁻⁵ |
| Po [mW] | 30 | [$P_{LD}$λ/hc * dS/S]ⁿ | 5.98 × 10²² |
| T [K] | 333 | (3/mk$_B$T)$^{0.5}$ | 5.17 × 10²² |
| dS [m²] | 1.80 × 10⁻⁸ | Porg [N/m²] | 7.70 × 10⁻¹ |
| S [m²] | 1.18 × 10⁻⁶ | Porg [atm] | 7.70 × 10⁻⁶ |

It is appreciated from Tables 16, 17 and 18 that, when the wavelength of the laser light is in the range from 395 nm to 415 nm and the optical output of the laser is equal to or lower than 30 mW, characteristics deterioration of the CAN package light emitting device within 1000 hours as the preferably required guaranteed operation time for practical use can be prevented by limiting the vapor pressure of Si organic compound gas in the package to and below $7.70 \times 10^{-1}$ N/m².

Table 19 shows the upper limit of the vapor pressure and parameters used for the calculation in case the wavelength of the laser light is 395 nm and the optical output of the laser is 300 mW. Table 20 shows the upper limit of the vapor pressure and parameters used for the calculation in case the wavelength of the laser light is 405 nm and the optical output of the laser is 300 mW. Table 21 shows the upper limit of the vapor pressure and parameters used for the calculation in case the wavelength of the laser light is 415 nm and the optical output of the laser is 300 mW.

TABLE 19

| | | | |
|---|---|---|---|
| λ [m] | 3.95 × 10⁻⁷ | dcr [m] | 6.37 × 10⁻⁸ |
| n | 1.55 | tcr [sec] | 3600000 |
| M | 147 | m [g] | 2.44 × 10⁻²⁵ |
| Guaranteed time [h] | 1000 | Pmax | 9.09 × 10⁻⁴ |
| Po [mW] | 300 | [$P_{LD}$λ/hc * dS/S]ⁿ | 3.68 × 10²⁴ |
| T [K] | 333 | (3/mk$_B$T)$^{0.5}$ | 5.17 × 10²² |
| dS [m²] | 1.80 × 10⁻⁸ | Porg [N/m²] | 1.19 × 10⁻² |
| S [m²] | 1.18 × 10⁻⁶ | Porg [atm] | 1.19 × 10⁻⁷ |

TABLE 20

| | | | |
|---|---|---|---|
| λ [m] | 4.05 × 10⁻⁷ | dcr [m] | 6.53 × 10⁻⁸ |
| n | 1.55 | tcr [sec] | 3600000 |
| M | 147 | m [g] | 2.44 × 10⁻²⁵ |
| Guaranteed time [h] | 1000 | Pmax | 9.09 × 10⁻⁴ |
| Po [mW] | 300 | [$P_{LD}$λ/hc * dS/S]ⁿ | 3.85 × 10²⁴ |
| T [K] | 333 | (3/mk$_B$T)$^{0.5}$ | 5.17 × 10²² |
| dS [m²] | 1.80 × 10⁻⁸ | Porg [N/m²] | 1.17 × 10⁻² |
| S [m²] | 1.18 × 10⁻⁶ | Porg [atm] | 1.17 × 10⁻⁷ |

TABLE 21

| | | | |
|---|---|---|---|
| λ [m] | 4.15 × 10⁻⁷ | dcr [m] | 6.69 × 10⁻⁸ |
| n | 1.55 | tcr [sec] | 3600000 |
| M | 147 | m [g] | 2.44 × 10⁻²⁵ |
| Guaranteed time [h] | 1000 | Pmax | 9.09 × 10⁻⁴ |
| Po [mW] | 300 | [$P_{LD}$λ/hc * dS/S]ⁿ | 4.02 × 10²⁴ |
| T [K] | 333 | (3/mk$_B$T)$^{0.5}$ | 5.17 × 10²² |
| dS [m²] | 1.80 × 10⁻⁸ | Porg [N/m²] | 1.14 × 10⁻² |
| S [m²] | 1.18 × 10⁻⁶ | Porg [atm] | 1.14 × 10⁻⁷ |

It is appreciated from Tables 19, 20 and 21 that, when the wavelength of the laser light is in the range from 395 nm to 415 nm and the optical output of the laser is equal to or lower than 300 mW, characteristics deterioration of the CAN package light emitting device within 1000 hours as the preferably required guaranteed operation time for practical use can be prevented by limiting the vapor pressure of Si organic compound gas in the package to and below $1.14 \times 10^{-2}$ N/m².

In the tables shown above, tcr represents the guaranteed operation time. The guaranteed operation time of 100 hours is the minimum value required for practical use, and the operation time of 1000 hours is the preferably required value for practical use. The symbol dcr represents the acceptable deposition thickness (wavelength/(4×refractive index)). The temperature 333 K is based on the temperature generally required as the guaranteed temperature of the laser).

Next explained is a manufacturing method of the CAN package light emitting device according to the embodiment of the invention. This manufacturing method is characterized in limiting the pressure of Si organic compound gas in the CAN package after sealed to and below a predetermined value by limiting the amount of Si organic compound contained in the adhesive.

First explained is a method of calculating the upper limit of Si organic compound contained in the organic adhesive. When V represents the volume of the CAN package 2, P represents the upper limit of the Si organic compound gas pressure in the CAN package 2, and T represents the temperature in the CAN package 2, the number of molecules Norg of the Si organic compound gas in the package is expressed as follows.

$$Norg = PV/(k_B T) \quad (19)$$

The result of analysis by TOF-SIMS demonstrates that the Si organic compound gas in the CAN package 2 contains $C_5H_{15}OSi_2^+$ whose molecular mass is 147 as its major component. Therefore, the total mass M of the Si organic compound g as in the CAN package 2 is:

$$M = 147/(6.02 \times 10^{23}) \times Norg \quad (20)$$
$$= 147/(6.02 \times 10^{23}) \times PV/(k_B T)$$

By substituting the upper limit of the vapor pressure calculated by Equation (18), volume V of the CAN package 2 and guaranteed temperature T for proper operation of the semiconductor laser into Equation (20), the mass of the Si-induced compound gas existing in the CAN package is calculated. This mass is determined as the upper limit of Si organic compound contained in the organic adhesive.

Shown below is a calculation method of the upper limit of the Si organic compound contained in the organic adhesive by using specific numerical value. For example, when substituting $5.4 \times 10^2$ N/m² as the upper limit P of the vapor pressure, $27 \times 10^{-9}$ m³ as the volume V of the CAN package 2 and 333 K as the guaranteed operative temperature T of the semiconductor laser into Equation (20), the mass M is determined as follows.

$$\text{Mass } M = 147/(6.02 \times 10^{23}) \times 3.2 \times 10^{15} = 7.75 \times 10^{-7} \text{ [g]}$$

Therefore, the vapor pressure of Si organic compound in the CAN package can be reduced to or below $5.4 \times 10^2$ N/m² by reducing the amount of Si organic compound contained in the adhesive to or below $7.75 \times 10^{-7}$ g.

For example, in case the amount of the adhesive used in the CAN package is 0.1 mg, the vapor pressure of the Si organic compound in the CAN package can be reduced to $5.4 \times 10^2$ N/m² by limiting the mass ratio to or below $7.8 \times 10^{-3}$.

Actually, Si organic compound contained in an organic adhesive does not vaporize by 100%. Therefore, the above-mentioned content of Si organic compound assures the use of 100 hours under the laser optical output of 3 mW.

To guarantee the use of 1000 hours for the output power of 30 mW, it is necessary to use a value calculated by substituting 0.80 N/m² into Equation (20) as the upper limit of Si organic compound gas.

Explained below is a manufacturing method of the CAN package light emitting device according to an embodiment of the invention with reference to FIGS. 14, 15 and 16. Assume here that the device includes only an organic adhesive bonding the heat sink 5 and the sub mount 6.

<Step of Mounting the Chip Mounting>

Figure 14A:
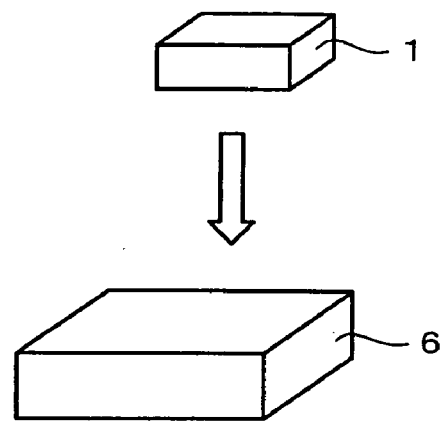
FIGS. 14A and 14B are schematic diagram showing a manufacturing method of the CAN package light emitting device according to the embodiment of the invention.

First referring to FIG. 14A, the semiconductor laser 1 is bonded on a predetermined position of the sub mount 6 with Sn solder.

<Die Bonding Step>

Figure 14B:
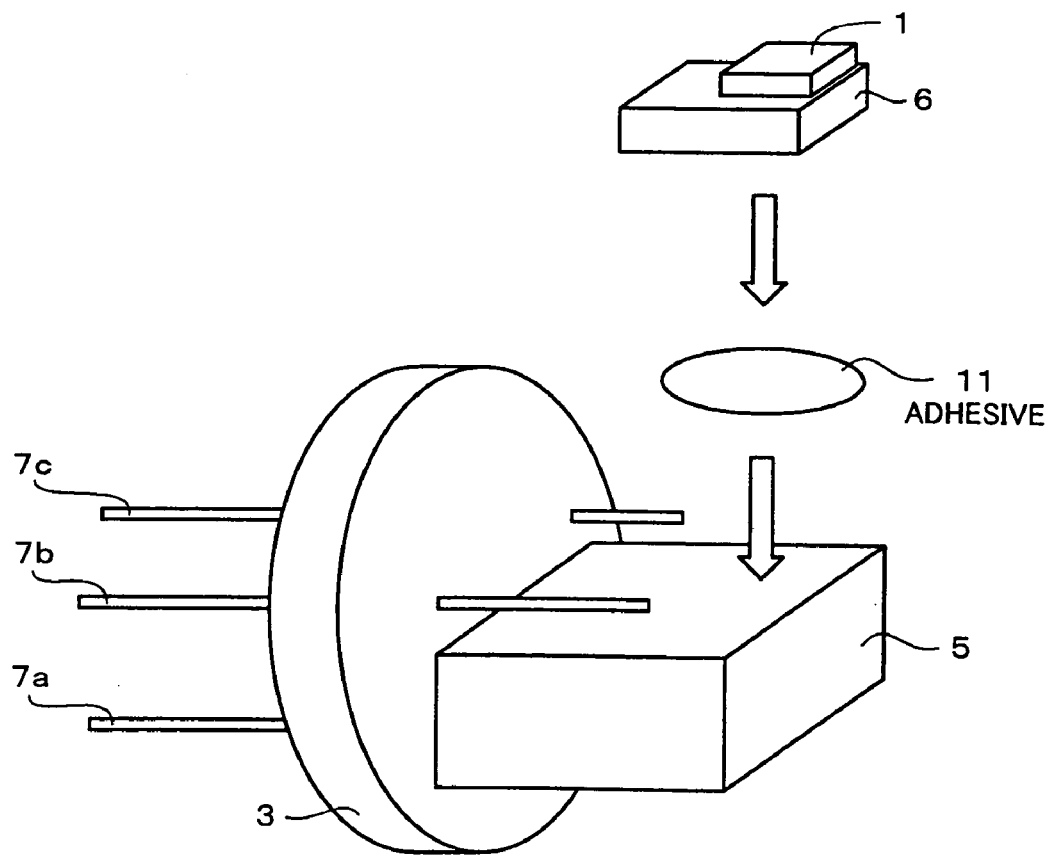

As shown in FIG. 14B, the sub mount 6 is next bonded on a predetermined position of the heat sink 5 extending from the fixing structure 3 by die bonding. In this process, an organic adhesive such as Ag paste (organic adhesive containing Ag powder) is used as the adhesive 11.

The Ag paste is limited in amount of Si organic compound contained therein in accordance with Equation (20). For example, if the upper limit of the vapor pressure is $5.4 \times 10^2$ N/m², volume V of the CAN package 2 is $27 \times 10^{-9}$ m³, and the guaranteed operative temperature of the semiconductor laser is 333 K, the content of the Si organic compound is limited to or below $7.75 \times 10^{-7}$ g.

<Step of Curing the Paste>

Figure 15A:
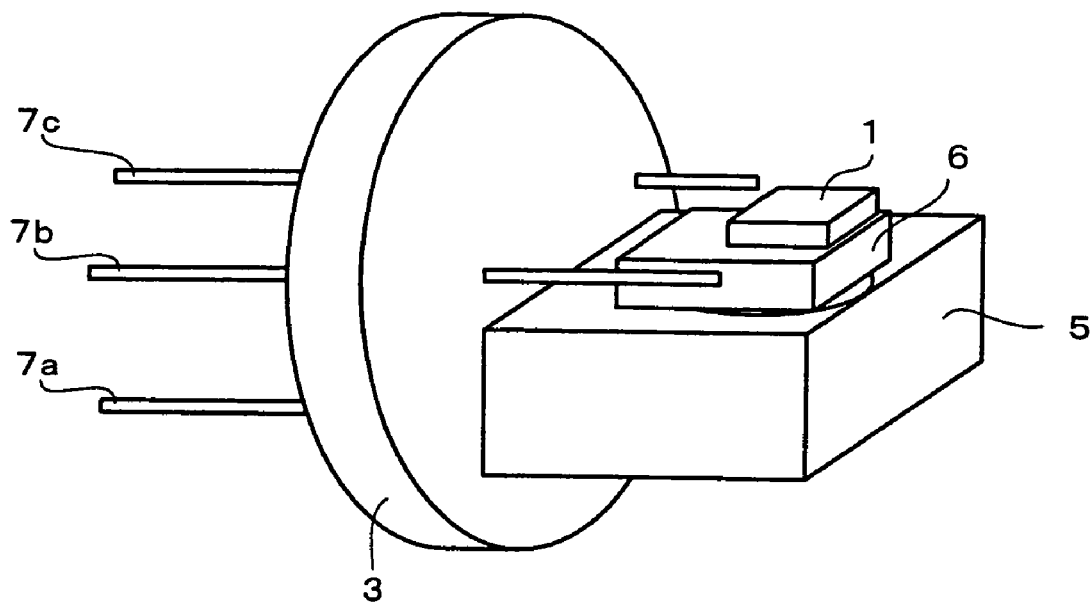
FIGS. 15A and 15B are schematic diagrams showing a manufacturing method of the CAN package light emitting device according to the embodiment of the invention.
Figure 16:
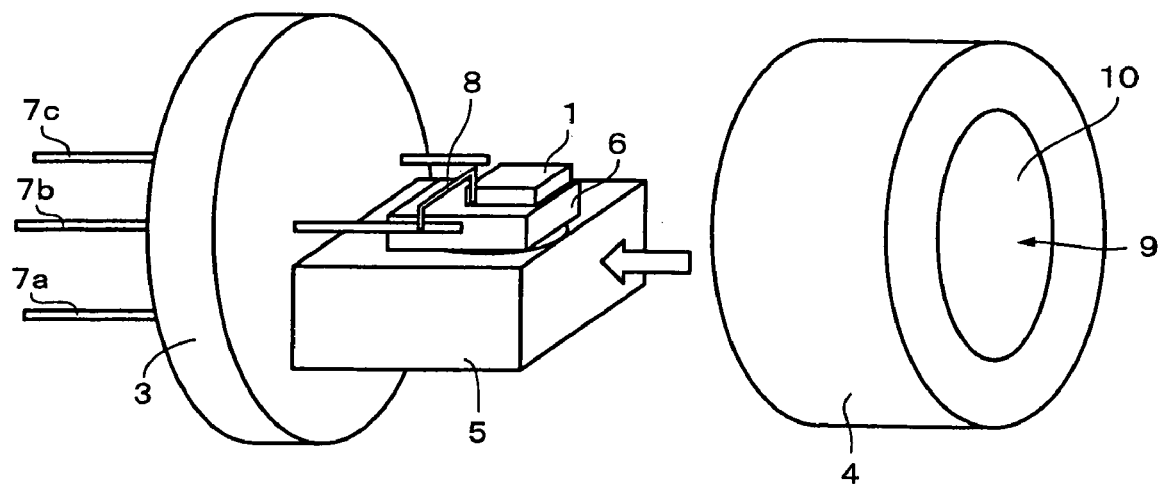
FIG. 16 is a schematic diagram showing a manufacturing method of the CAN package light emitting device according to the embodiment of the invention.
Figure 17:
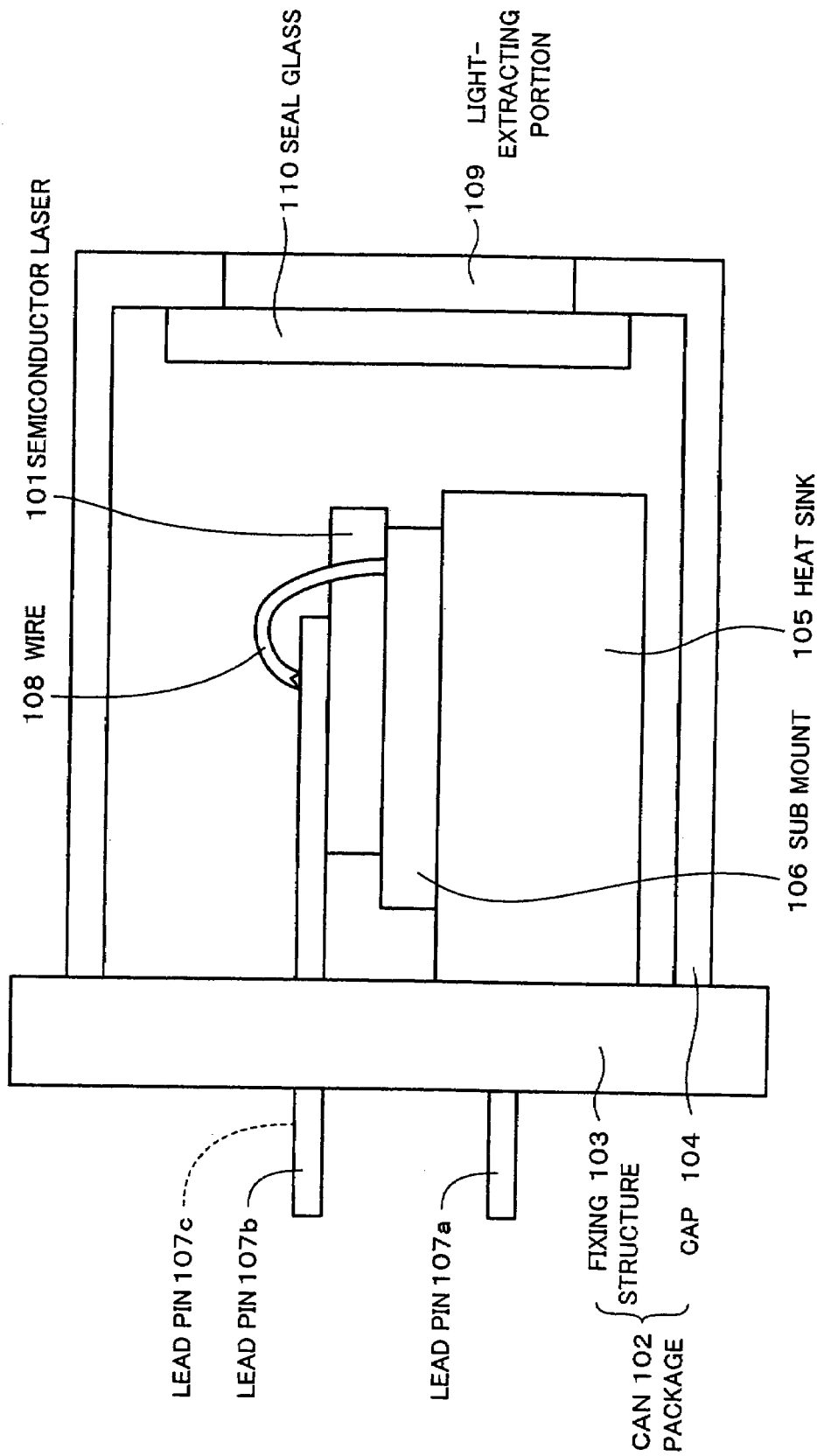
FIG. 17 is a schematic diagram showing a configuration of a conventional CAN package light emitting device.
Figure 18:
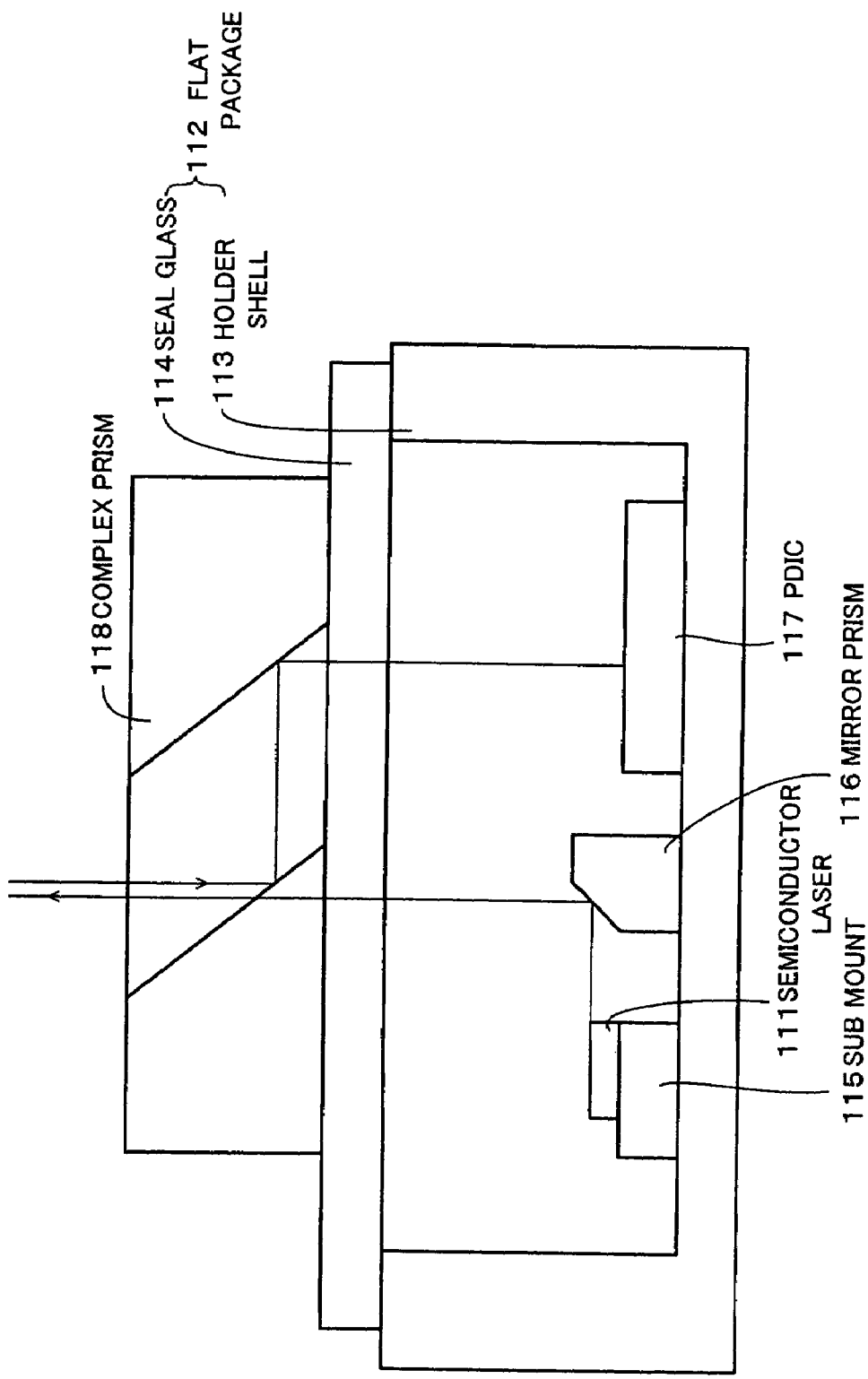
FIG. 18 is a schematic diagram showing a configuration of a conventional flat package light emitting device.
Figure 19:
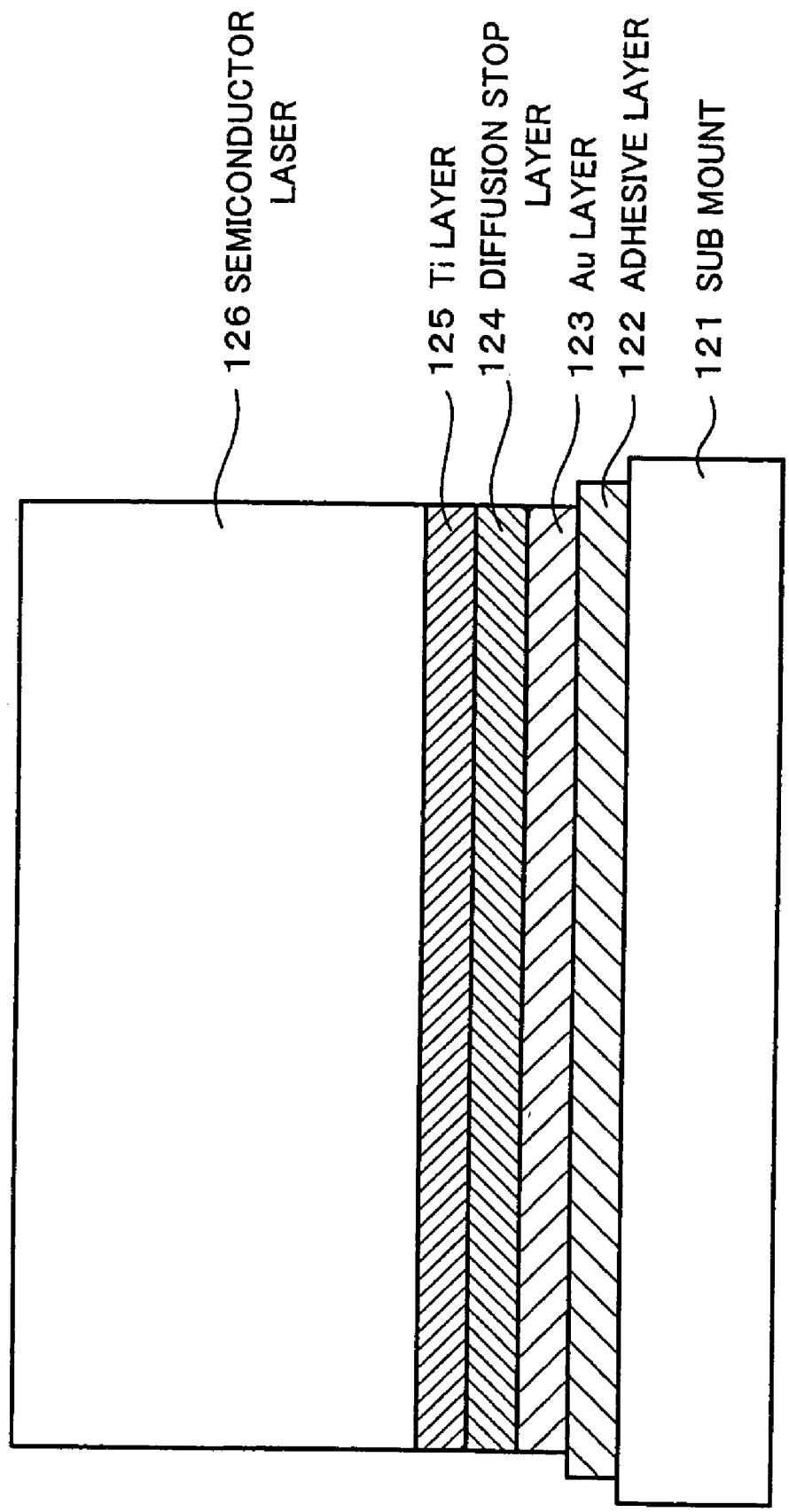
FIG. 19 is a schematic diagram showing a semiconductor laser.

After that, the adhesive 11 is hardened as shown in FIG. 15A.

<Wire Bonding Step>

Figure 15B:
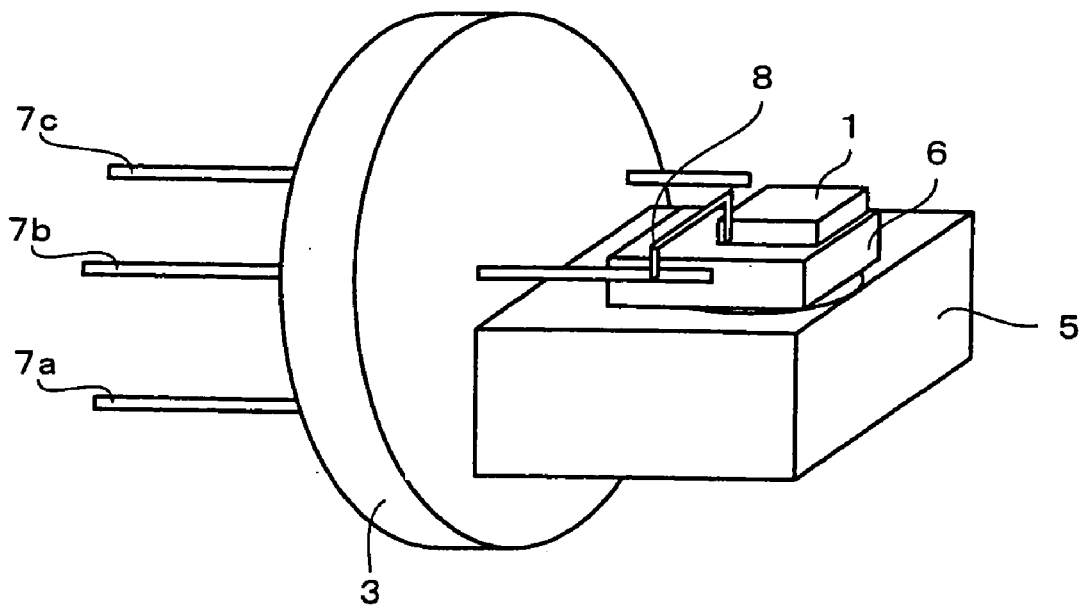

Thereafter, the sub mount 6 and the lead pin 7b are connected with the Au wire 8 as shown in FIG. 15B.

<Sealing Step>

After that, the cap 4 is secured to the fixing structure 3 by electric welding in an oxygen atmosphere from which moisture ($H_2O$) has been removed. Thereby, the CAN package light emitting device enclosing dry oxygen is completed. In this sealing step, another kind of gas, such as $N_2$ (nitrogen) gas, Ar (argon) gas, He (helium) gas or mixed gas combining $N_2$ and $O_2$, may be used as the gas to be enclosed in the CAN package light emitting device (displacement gas) in lieu of dry oxygen.

Next explained is a method of measuring the gas vapor pressure of Si organic gas in the CAN package light emitting device according to the same embodiment.

The cover glass is cleaned first. Then, the same organic adhesive as that used for bonding components mounted in the CAN package 2 is coated on the cover glass. In this step, 1 g or more of the adhesive is preferably coated, taking account of the measurement sensitivity of gas chromatography mass-spectroscopy referred to later.

Thereafter, the organic adhesive coated on the cover glass is cured, and next introduced into a glass bottle. The glass bottle is sealed thereafter. Then, just before starting gas chromatography mass spectroscopy, an amount of gas is collected from the glass bottle by using a needle, for example. In this step, the volume $V_1$ of the collected gas should be measured.

After that, molecular weight of the component of the collected gas and number of detected molecules $N_1$ are calculated by gas chromatography mass spectroscopy (see, T. Katoda, "Semiconductor Evaluating Technology", Sangyo Tosho). Result of the analysis demonstrates that $N_1$ molecules having the molecular mass $M_1$ exist in the volume $V_1$.

By using the volume $V_1$, molecular mass $M_1$ and number of molecules $N_1$, reduced vapor pressure P of the collected gas is calculated from the following equation.

$$P = N_1/V_1 \times k_B T \qquad (21)$$

Reduced mass of the collected gas can be calculated from the following equation.

$$\text{Reduced mass of collected gas} = N_1 \times M_1/(\text{Avogadro's number}) \qquad (22)$$

"Reduced mass/m1" is the mass concentration ratio of molecules of the molecular weight $M_1$ approximately estimated to be contained in the adhesive. For more accuracy, it is recommended to specify the weight ratio $R_1$ in terms of the added Si organic compound when the adhesive to be used is prepared. Thereafter, GC-MS analysis is carried out in the above-explained procedures. Thus, the mass of molecules of the molecular weight $M_1$ in the mass of the adhesive $m_1$ is:

$$R_1 \times m_1$$

Since the number of detected molecules is $N_1$, detection ratio RGM is obtained. The detection ratio represents how much ratio of the collected gas molecules is detected. Once this detection ratio is specified, the number of collected gas molecules is determined accurately, and the reduced vapor pressure and reduced weight ratio derived therefrom are determined accurately.

On the other hand, the vapor pressure is low just after sealing, but gradually increases until saturates at a certain level. That is, it reaches the saturated vapor pressure, which is the thermal equilibrium state. The saturated vapor pressure varies exclusively with temperature, and does not depend on the volume of the container housing the vapor.

Therefore, the saturated vapor pressure determined from GC-MS in this manner corresponds to the gas concentration in the actual device.

On the other hand, regarding actual devices, after ten minutes from the sealing, sealing parts are decomposed, several pieces thereof are put in a sample bottle, and the bottle is sealed immediately. In this process, a quantity of devices corresponding to 1 g of the adhesive material is preferably introduced. Thereafter, the vapor pressure can be determined here again by conducting GC-MS in the same manner.

According to the embodiment of the invention, the following effects are obtained.

Since the vapor pressure of Si organic compound gas in the CAN package is limited to or below $5.4 \times 10^2$ N/m² in a CAN package light emitting device for emitting laser light with output power of 3 mW and a wavelength around 395 nm, it is possible to prevent that any deposit as thick as inviting characteristics deterioration of the CAN package light emitting device is formed on the light emitting portion of the light emitting element thereof in the guaranteed time of 100 hours. Therefore, the CAN package light emitting device is prevented from fluctuation of the drive current, fluctuation of the optical output, changes of the beam profile and deviation of the optical axis within the guaranteed time of 100 hours.

Further, since the vapor pressure of Si organic compound gas in the CAN package is limited to or below $8.02 \times 10^{-1}$ N/m² in a CAN package light emitting device for emitting laser light with output power of 30 mW and a wavelength around 395 nm, it is possible to prevent that any deposit as thick as inviting characteristics deterioration of the CAN package light emitting device is formed on the light emitting portion of the light emitting element thereof in the guaranteed time of 1000 hours. Therefore, the CAN package light emitting device is prevented from fluctuation of the drive current, fluctuation of the optical output, changes of the beam profile and deviation of the optical axis within the guaranteed time of 1000 hours.

Furthermore, since the vapor pressure of Si organic compound gas in the CAN package is limited to or below $1.2 \times 10^{-2}$ N/m$^2$ in a CAN package light emitting device for emitting laser light with output power of 300 mW and a wavelength around 395 nm, it is possible to prevent that any deposit as thick as inviting characteristics deterioration of the CAN package light emitting device is formed on the light emitting portion of the light emitting element thereof in the guaranteed time of 100 hours. Therefore, the CAN package light emitting device is prevented from fluctuation of the drive current, fluctuation of the optical output, changes of the beam profile and deviation of the optical axis within the guaranteed time of 100 hours.

Moreover, stable operation of the CAN package light emitting device can be realized. In addition, even when a semiconductor laser for a short wavelength such as 405 nm, for example, is housed in the CAN package, characteristics deterioration of the CAN package light emitting device, it is presented that any deposit as thick as inviting characteristics deterioration is formed on the light emitting portion of the light emitting element, and this permits more enhancement of the density of optical discs. Further, even when a semiconductor laser for output power of 30 mW or 300 mW is housed in a CAN package, the CAN package light emitting device can be prevented from characteristics deterioration, and this permits more enhancement of density of optical discs.

Moreover, it is possible to prevent that Si organic compound gas generated from an organic adhesive or organic resin adheres onto a member forming a light path and invites degradation of the transmittance (which can be regarded as a kind of deterioration of transmittance because the optical power decreases under a constant current), deterioration of the far field pattern, deviation of the optical axis, and so on.

Heretofore, a specific embodiment of the invention has been explained. However, the invention is not limited to the specific embodiment, but contemplate various changed and modification based on the technical concept of the invention.

For example, numerical values indicated in the explanation of the embodiment are nothing but examples, and other numerical values may be used where necessary.

Further, the foregoing embodiment has been explained as applying the present invention to package light emitting devices housing only a semiconductor laser in a package. However, it will be needless to say that the invention is applicable to package light emitting devices housing integrated optical elements in a package as well.

Further, although the foregoing embodiment has been explained as applying the present invention to CAN package light emitting devices, it will be needless to say that the invention is applicable to optical devices using a plastic mold package or optical devices using an adhesive as well.

The above-explained embodiment may be modified to use an adhesive, plastic mold, or the like, containing silane or siloxane.

As described above, according to the present invention, it is possible to prevent that any deposit as thick as inviting characteristics deterioration is formed on the light emitting portion of the light emitting element, and it is therefore possible to prevent periodical changes of the drive current and deterioration of the beam form.

The invention claimed is:

1. A light emitting device comprising:
   a light emitting element which is a group III nitride semiconductor laser and emits a light having a wavelength in the range from 395 nm to 415 nm;
   a sub mount on which the semiconductor laser is bonded with a solder;
   a heat sink on which the sub mount is bonded with Ag paste containing an organic adhesive and Si organic compound; and
   a package hermetically sealed and housing at least the light emitting device and the sub mount and the heat sink; wherein the vapor pressure of Si organic compound gas in the package by gas chromatography mass-spectroscopy is lower than or equal to $5.4 \times 10^2$ N/m$^2$ in case the optical output of the laser is 3 mW and is lower than or equal to $8.02 \times 10^{-1}$ N/m$^2$ in case the optical output of the laser is 30 mW and is lower than or equal to $1.2 \times 10^{-2}$ N/m$^2$ in case the optical output of the laser is 300 mW.

* * * * *